United States Patent
Kobayashi et al.

(10) Patent No.: US 10,186,532 B2
(45) Date of Patent: Jan. 22, 2019

(54) IMAGE DEVICE, IMAGE SYSTEM, AND CONTROL METHOD OF IMAGE DEVICE

(71) Applicant: CANON KABUSHIKI KAISHA, Tokyo (JP)

(72) Inventors: Masahiro Kobayashi, Tokyo (JP); Takeshi Ichikawa, Hachioji (JP); Yusuke Onuki, Fujisawa (JP); Masaaki Minowa, Kawasaki (JP); Kazunari Kawabata, Kawasaki (JP); Hiroshi Sekine, Kawagoe (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 13 days.

(21) Appl. No.: 15/237,272

(22) Filed: Aug. 15, 2016

(65) Prior Publication Data
US 2017/0078604 A1    Mar. 16, 2017

(30) Foreign Application Priority Data

Sep. 11, 2015 (JP) ................................ 2015-179226

(51) Int. Cl.
*H01L 27/146* (2006.01)
*H04N 5/355* (2011.01)
*H04N 5/357* (2011.01)

(52) U.S. Cl.
CPC ......... *H01L 27/146* (2013.01); *H04N 5/3575* (2013.01); *H04N 5/35572* (2013.01)

(58) Field of Classification Search
CPC ............ H01L 27/146; H01L 27/14609; H04N 5/35572; H04N 5/3575
(Continued)

(56) References Cited

U.S. PATENT DOCUMENTS 7,271,835 B2   9/2007  Iizuka et al.
7,436,343 B2   10/2008 Ichikawa
(Continued)

FOREIGN PATENT DOCUMENTS

JP    2004-111590    4/2004
JP    2006-246450    9/2006

OTHER PUBLICATIONS

U.S. Appl. No. 15/136,017, filed Apr. 22, 2016.
(Continued)

*Primary Examiner* — Sinh Tran
*Assistant Examiner* — Zhenzhen Wu
(74) *Attorney, Agent, or Firm* — Venable, LLP

(57) ABSTRACT

An image device transfers charges of a previous frame from the holding units to the amplification units, during a read-out period of each frame, the read-out period includes a period in which a plurality of overflow transistors are in an on-state and a first period in which a plurality of photoelectric conversion units accumulate charges, and, during a second period following the first period, the plurality of photoelectric conversion units of the plurality of pixels accumulate charges while the plurality of holding units of the plurality of pixels hold the charges accumulated during the first period. During the first and second periods, each of the plurality of pixels performs a plurality of times of charge transfers from the photoelectric conversion unit to the holding unit. The plurality of times of charge transfers including a charge transfer performed at the end of the second period.

19 Claims, 14 Drawing Sheets

(58) Field of Classification Search
USPC ....... 348/294, 295, 296, 298, 299, 300, 301, 348/230.1
See application file for complete search history.

(56) References Cited

U.S. PATENT DOCUMENTS

| | | |
|---|---|---|
| 7,462,810 B2 | 12/2008 | Kobayashi |
| 7,687,299 B2 | 3/2010 | Ichikawa |
| 7,928,477 B2 | 4/2011 | Kobayashi |
| 7,935,995 B2 | 5/2011 | Watanabe |
| 7,968,922 B2 | 6/2011 | Ichikawa |
| 8,045,034 B2 | 10/2011 | Shibata |
| 8,063,351 B2 | 11/2011 | Kobayashi |
| 8,115,848 B2 | 2/2012 | Onuki |
| 8,174,604 B2 | 5/2012 | Shibata |
| 8,222,682 B2 | 7/2012 | Watanabe |
| 8,259,206 B1 | 9/2012 | Shibata |
| 8,289,432 B2 | 10/2012 | Shibata |
| 8,357,956 B2 | 1/2013 | Kobayashi |
| 8,427,564 B2 | 4/2013 | Yamashita |
| 8,456,559 B2 | 6/2013 | Yamashita |
| 8,552,353 B2 | 10/2013 | Kobayashi |
| 8,723,232 B2 | 5/2014 | Kobayashi |
| 8,736,734 B2 | 5/2014 | Onuki |
| 8,749,683 B2 | 6/2014 | Minowa |
| 8,779,544 B2 | 7/2014 | Yamashita |
| 8,884,391 B2 | 11/2014 | Fudaba |
| 9,147,708 B2 | 9/2015 | Okita |
| 9,153,610 B2 | 10/2015 | Kobayashi |
| 9,232,164 B2 | 1/2016 | Minowa |
| 9,276,027 B2 | 3/2016 | Okita |
| 9,300,884 B2 | 3/2016 | Minowa |
| 9,344,653 B2 | 5/2016 | Shimotsusa |
| 9,419,038 B2 | 8/2016 | Kobayashi |
| 9,445,026 B2 | 9/2016 | Kobayashi |
| 2006/0044439 A1* | 3/2006 | Hiyama ............ H01L 27/14603 348/308 |
| 2009/0321799 A1* | 12/2009 | Velichko ............ H04N 5/35572 257/292 |
| 2010/0165167 A1* | 7/2010 | Sugiyama ............ H04N 5/3597 348/311 |
| 2010/0188543 A1* | 7/2010 | Oike ................ H01L 27/14609 348/308 |
| 2011/0136291 A1 | 6/2011 | Iwata |
| 2013/0206965 A1 | 8/2013 | Yamashita |
| 2014/0036121 A1* | 2/2014 | Minowa ............ H04N 5/37457 348/301 |
| 2014/0061436 A1 | 3/2014 | Kobayashi |
| 2015/0076323 A1* | 3/2015 | Mabuchi ........... H01L 27/14609 250/208.1 |
| 2015/0222836 A1 | 8/2015 | Wada |
| 2015/0264283 A1 | 9/2015 | Kobayashi |
| 2015/0281614 A1 | 10/2015 | Yoshida |
| 2016/0027825 A1 | 1/2016 | Moriyama |
| 2016/0071896 A1 | 3/2016 | Kawabata |
| 2016/0071902 A1 | 3/2016 | Okita |
| 2016/0099268 A1 | 4/2016 | Minowa |
| 2016/0133663 A1 | 5/2016 | Minowa |
| 2016/0155774 A1 | 6/2016 | Hasegawa |
| 2016/0173797 A1 | 6/2016 | Minowa |
| 2016/0227139 A1 | 8/2016 | Shimotsusa |
| 2017/0070691 A1* | 3/2017 | Nishikido .......... H04N 5/35581 |

OTHER PUBLICATIONS

U.S. Appl. No. 15/137,474, filed Apr. 25, 2016.
U.S. Appl. No. 15/163,986, filed May 25, 2016.
U.S. Appl. No. 15/251,341, filed Aug. 30, 2016.
U.S. Appl. No. 15/207,289, filed Jul. 11, 2016.
U.S. Appl. No. 15/227,576, filed Aug. 3, 2016.
U.S. Appl. No. 15/237,255, filed Aug. 15, 2016.
U.S. Appl. No. 15/226,651, filed Aug. 2, 2016.
U.S. Appl. No. 15/258,805, filed Sep. 7, 2016.

* cited by examiner

IMAGE DEVICE, IMAGE SYSTEM, AND CONTROL METHOD OF IMAGE DEVICE

BACKGROUND OF THE INVENTION

Field of the Invention

The present invention relates to an image device, an image system, and a control method of the image device, in which the image device has a global electronic shutter function.

Description of the Related Art

In recent years, a global electronic shutter has been proposed in CMOS image sensors. Image devices disclosed in Japanese Patent Application Laid-open No. 2004-111590 and Japanese Patent Application Laid-open No. 2006-246450 use a global electronic shutter to avoid a distortion in an image of a subject that is moving fast.

The image device disclosed in Japanese Patent Application Laid-open No. 2004-111590 accumulates all the charges generated by photoelectric conversions in photoelectric conversion units and then transfers charges for one frame from the photoelectric conversion units to holding units at the same time in all the pixels. This realizes a global electronic shutter. In this case, in order to increase the saturation charge amount of a pixel, it is necessary to increase both the saturation charge amount of the photoelectric conversion unit and the saturation charge amount of the holding unit. However, an increase in the saturation charge amount of the photoelectric conversion unit causes an increase in the area of the photoelectric conversion unit resulting in an increased pixel size.

The image device disclosed in Japanese Patent Application Laid-open No. 2006-246450 holds charges in holding units without accumulating charges in photoelectric conversion units. Therefore, it may be possible to increase the saturation charge amount of a pixel without increasing the saturation charge amount of the photoelectric conversion unit. In this technology, however, since there is a period in which charges generated by a photoelectric conversion are unable to be accumulated, the image quality may be degraded.

SUMMARY OF THE INVENTION

An image device according to one embodiment of the present invention includes: a plurality of pixels, each of the pixels including a photoelectric conversion unit that accumulates charges generated by photoelectric conversions, a holding unit that holds the charges, an amplification unit that outputs signals based on the charges, a first transfer transistor that transfers the charges from the photoelectric conversion unit to the holding unit, a second transfer transistor that transfers the charges from the holding unit to the respective amplification unit, and an overflow transistor that drains the charges accumulated in the photoelectric conversion unit, wherein, in a read-out period of each frame, the second transfer transistors of the plurality of pixels are sequentially turned on to cause the charges of a previous frame to be transferred from the holding units to the amplification units, wherein the read-out period includes a drain period in which the overflow transistors of the plurality of pixels are in an on-state and a first period in which the overflow transistors and the first transfer transistors of the plurality of pixels are off-state to cause the photoelectric conversion units of the plurality of pixels to accumulate charges, wherein, in a second period following the first period, the photoelectric conversion units of the plurality of pixels accumulate charges generated in the second period while the holding units of the plurality of pixels hold the charges accumulated during the first period, and wherein, in the first and second periods, each of the plurality of pixels performs a plurality of times of charge transfers from the photoelectric conversion units to the holding units by turning on the first transfer transistors, the plurality of times of charge transfer including a charge transfer performed at the end of the second period.

Further, an image device according to another embodiment of the present invention includes: a plurality of pixels, each of the pixels including a photoelectric conversion unit that accumulates charges generated by a photoelectric conversion, a holding unit that holds the charges, an amplification unit that outputs signals based on the charges, a first transfer transistor that transfers the charges from the photoelectric conversion unit to the respective holding unit, and a second transfer transistor that transfers the charges from the holding unit to the amplification unit, wherein, in a first period, the first transfer transistors of the plurality of pixels are in an off-state to cause the photoelectric conversion unit of the plurality of pixels to accumulate charges, wherein, in a second period following the first period, the photoelectric conversion units of the plurality of pixels accumulate charges generated during the second period while the holding units of the plurality of pixels hold the charges accumulated in the first period, and wherein, in the first and second periods, each of the plurality of pixels performs a plurality of times of charge transfers from the photoelectric conversion unit to the holding unit by turning on the first transfer transistor, the plurality of times of charge transfer including a charge transfer performed at the end of the second period, and an interval of the plurality of times of charge transfers is constant.

Further features of the present invention will become apparent from the following description of exemplary embodiments with reference to the attached drawings.

DESCRIPTION OF THE EMBODIMENTS

Figure 1:
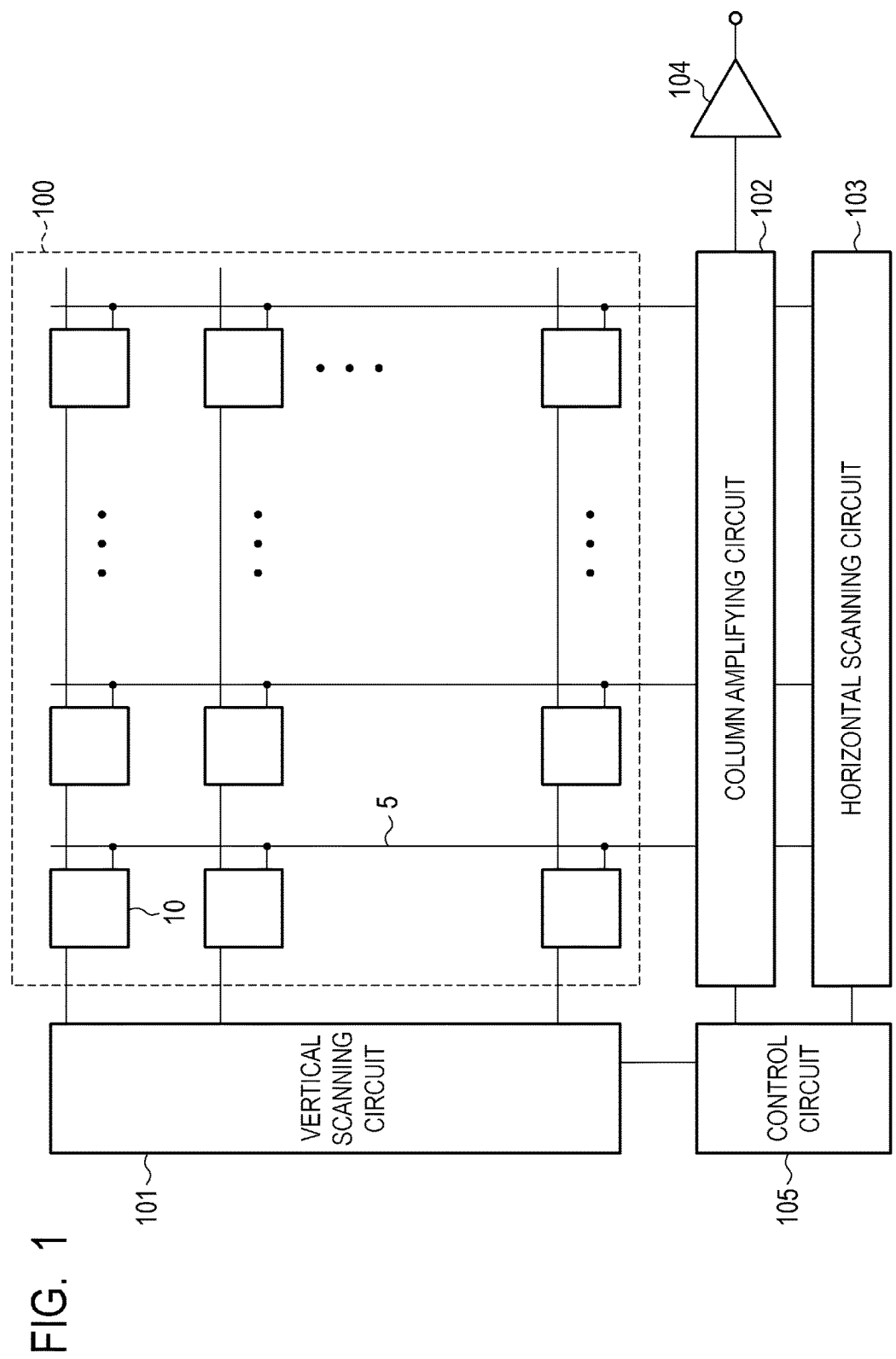
FIG. 1 is a block diagram illustrating a general configuration of an image device according to a first embodiment of the present invention.

Preferred embodiments of the present invention will now be described in detail in accordance with the accompanying drawings.

An image device according to one embodiment of the present invention includes a plurality of pixels, and each of the pixels has a photoelectric conversion unit, a holding unit that holds charges, and an amplification unit that outputs a signal based on charges. Each of the pixels further includes a first transfer transistor that transfers charges from the photoelectric conversion unit to the holding unit, a second transfer transistor that transfers charges from the holding unit to the amplification unit, and an overflow transistor that drains charges of the photoelectric conversion unit. Such a configuration allows for performing a so-called global electronic shutter, that is, a capturing operation such that photoelectric conversion periods for a plurality of pixels match each other. An electronic shutter refers to a capturing operation for electrically controlling accumulation of charges generated by an incident light.

During each frame read-out period, in response to a plurality of second transfer transistors being sequentially turned on, the charges of a previous frame is sequentially transferred from the holding units to the amplification units.

The number of signals to be output during a read-out period can be changed depending on the format of an image to be output. For example, when a motion image is taken, it is preferable to output signals for the number of horizontal lines used for one frame. Note that signals may not be output from all the pixels of the image device.

The read-out period includes a drain period in which a plurality of overflow transistors are turned on and a first period in which the plurality of overflow transistors and a plurality of first transfer transistors are turned off allowing a plurality of photoelectric conversion units to accumulate charges. During a second period following the first period, the plurality of photoelectric conversion units accumulate new charges while a plurality of holding units hold charges accumulated during the first period. During the first and second periods, a plurality of times of charge transfers from the photoelectric conversion units to the holding units, including the last time of charge transfer in the second period, are performed.

Since it is sufficient for the photoelectric conversion unit to accumulate at least charges generated during the first period, the saturation charge amount of a pixel can be maintained with a use of a photoelectric conversion unit having a small saturation charge amount. It is therefore to realize a global electronic shutter while maintaining the saturation charge amount of a pixel with a reduced pixel size. Although the first and second periods may be the same length in a first embodiment, the second period in which the holding units of a plurality of pixels hold charges is longer than the first period in some embodiments. In this case, during the second period, multiple times of charge transfers from the photoelectric conversion units to the holding units allow for a further reduction in the saturation charge amount of the photoelectric conversion units.

The image device according to another embodiment of the present invention includes a plurality of pixels, and each of the pixels has a photoelectric conversion unit, a holding unit that holds charges, and an amplification unit that outputs a signal based on charges. The pixel further includes a first transfer transistor that transfers charges from the photoelectric conversion unit to the holding unit and a second transfer transistor that transfers charges from the holding unit to the amplification unit.

During a first period, in response to a plurality of first transfer transistors being turned off, a plurality of photoelectric conversion units accumulate charges. During a second period following the first period, the plurality of photoelectric conversion units accumulate charges while a plurality of holding units hold charges accumulated during the first period. Further, during the first and second periods, a plurality of times of charge transfers from the photoelectric conversion units to the holding units, including the last transfer charge in the second period, are performed. Since it is sufficient for the photoelectric conversion unit to accumulate at least charges generated during the first period, a photoelectric conversion unit with a small saturation charge amount can be used. Further, with a constant interval of charge transfers, a photoelectric conversion unit having a smaller saturation charge amount can be used and the sizes of the photoelectric conversion unit and the charge holding unit can be optimized.

Embodiments of the present invention will be described below with reference to the drawings. The present invention is not limited to the embodiments described below, and a part of the configuration of any of the embodiments described below may be added to the configuration of another embodiment or may be replaced with a part of the configuration of another embodiment, for example.

First Embodiment

FIG. 1 is a block diagram illustrating a general configuration of an image device according to the present embodiment. The image device includes a pixel unit 100, a vertical scanning circuit 101, a column amplification circuit 102, a horizontal scanning circuit 103, an output circuit 104, and a control circuit 105. The pixel unit 100 includes a plurality of pixels 10 arranged in an X-Y matrix. The vertical scanning circuit 101 supplies control signals for controlling transistors of the pixels 10 to be turned on (in a conduction state) or off (in a non-conduction state). Column signal lines 5 are provided on respective columns of the pixels 10, and signals from the pixels 10 are read out to the column signal lines 5 on a column basis. The column amplification circuit 102 amplifies pixel signals output to the column signal lines 5, and performs a correlated double sampling process based on signals occurring at a resetting of the pixels 10 and a photoelectric conversion. The horizontal scanning circuit 103 has a switch connected to an amplifier of the column amplification circuit 102 and supplies a control signal for controlling the switch to be turned on or off. The output circuit 104 is formed of a buffer amplifier, a differential amplifier, or the like and outputs pixel signals from the column amplification circuit 102 to a signal processor outside the image device. Note that an AD convertor may be provided in the image device to output digital image signals.

Figure 2:
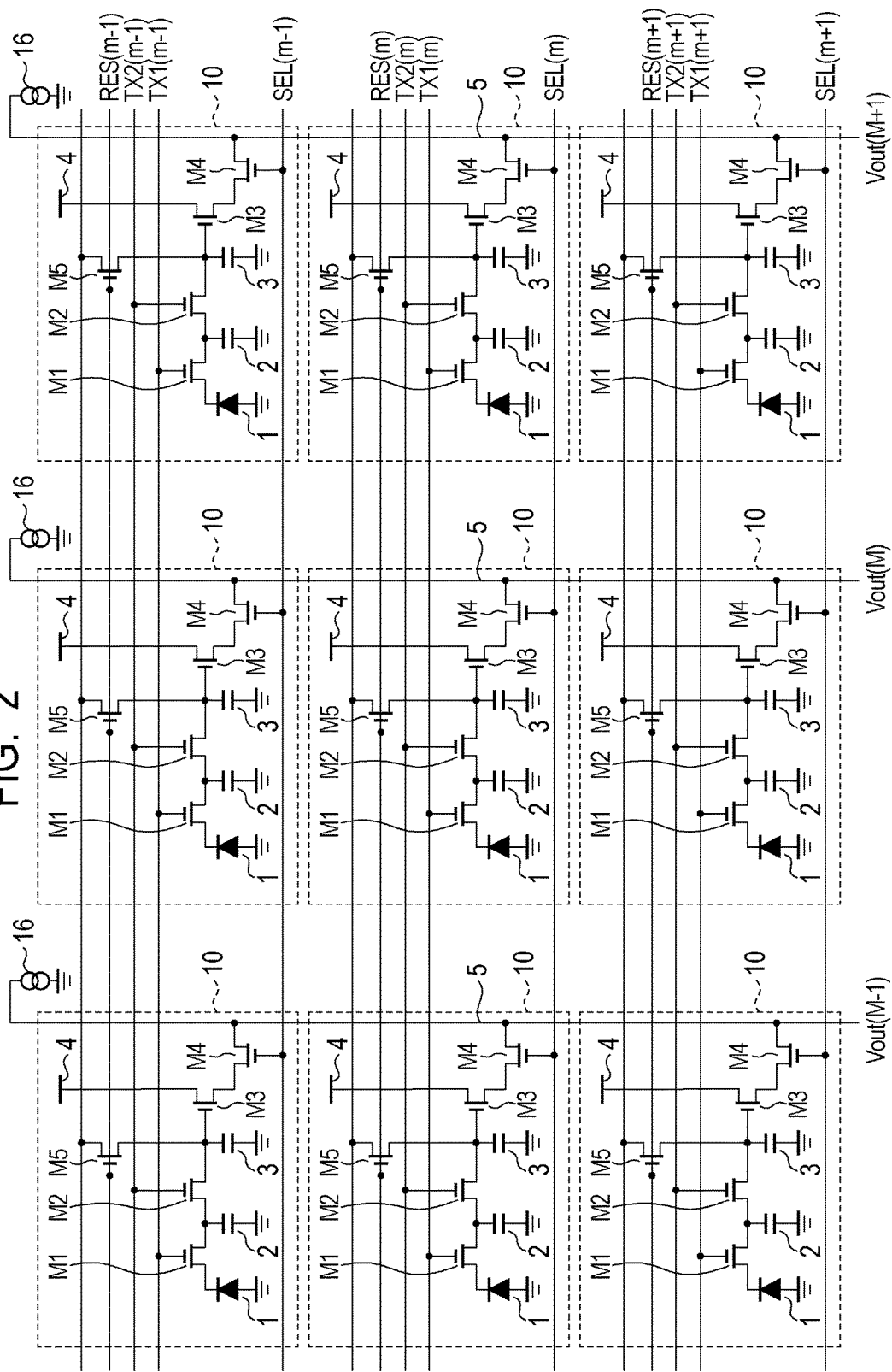
FIG. 2 is a diagram illustrating an equivalent circuit of pixels in the image device according to the first embodiment of the present invention.

FIG. 2 illustrates an equivalent circuit of the pixels 10 in the image device according to the present embodiment. Although FIG. 2 illustrates nine pixels 10, which are arranged in three rows by three columns, out of a plurality of pixels 10 that are two-dimensionally aligned in the row direction and the column direction, the image device has more pixels. Each pixel 10 includes a photoelectric conversion unit 1, a holding unit 2, a floating diffusion unit 3, a first transfer transistor M1, a second transfer transistor M2, an amplification transistor M3, a selection transistor M4, and a reset transistor M5.

Each photoelectric conversion unit 1 photoelectrically converts an incident light and accumulates charges by the photoelectric conversion. Each first transfer transistor M1, when being in an on-state, transfers charges of the photoelectric conversion unit 1 to the holding unit 2. Each holding unit 2 holds charges transferred from the photoelectric conversion unit 1. Each second transfer transistor M2, when being in an on-state, transfers charges of the holding unit 2 to the floating diffusion unit 3 of the amplification transistor M3. The drain of the amplification transistor M3 is connected to a power supply voltage line 4, and the source is connected to the column signal line 5 via the selection transistor M4. Each amplification transistor M3 forms a source follower and outputs a signal based on the voltage of the floating diffusion unit 3 to the column signal line 5 via the selection transistor M4. Each column signal line 5 is connected to a constant current source 16. Each reset transistor M5, when being in an on-state, resets the voltage of the floating diffusion unit 3. In the following description, the floating diffusion unit 3, the amplification transistor M3, the selection transistor M4, and the reset transistor M5 may be collectively referred to as an output unit.

A common control signal is supplied to the pixels 10 on the same column from the vertical scanning circuit 101. That is, control signals TX1(m), TX2(m), SEL(m), and RES(m) are supplied to the first transfer transistor M1, the second transfer transistor M2, the selection transistor M4, and the reset transistor M5 on the pixels 10 on the m-th row, respectively. Each of these transistors is turned on when the associated control single is a high level, and turned off when the associated control signal is a low level. Exposure time periods in the plurality of pixels 10 can be simultaneously controlled by controlling the first control signal of each row to be simultaneously turned on or off. Such a configuration allows the photoelectric conversion units 1 to accumulate newly generated charges while the holding units 2 are holding charges and therefore allows for performing a global electronic shutter that causes photoelectric conversion periods in a plurality of pixels to match each other. Note that the plurality of pixels 10 may share a single amplification unit. Further, the pixel unit 100 may include, in addition to effective pixels, pixels each of which outputs no image such as a dummy pixel that has neither optical black pixel nor photoelectric conversion unit.

Figure 3:
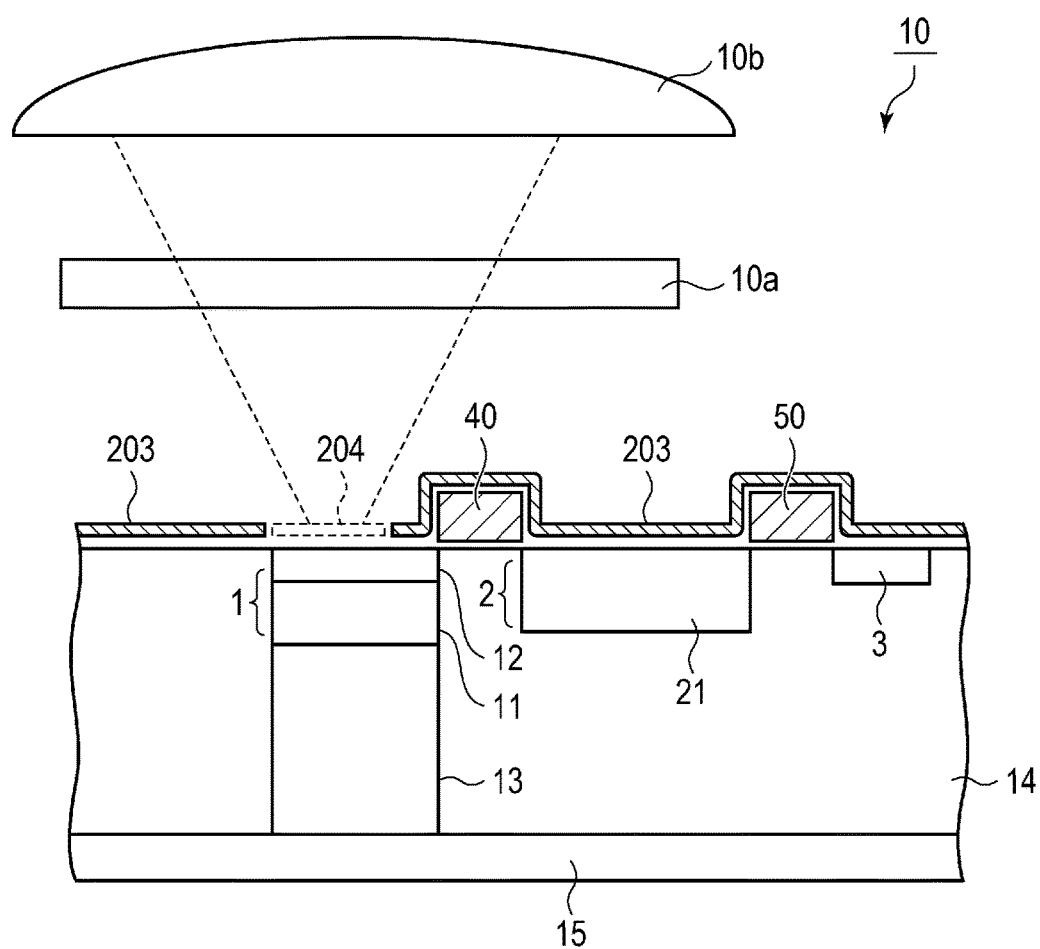
FIG. 3 is a diagram schematically illustrating sectional structure of a pixel of the image device according to the first embodiment of the present invention.

FIG. 3 is a diagram schematically illustrates the sectional structure of the pixel 10 in the image device according to the present embodiment.

The photoelectric conversion unit 1 is disposed in a P-type well region 14 and has an N-type semiconductor region 11 and a P-type semiconductor region 12. The semiconductor region 11 and the semiconductor region 12 form a PN junction and forms embedded photodiode structure. An incident light is photoelectrically converted in the PN junction and accumulated in the N-type semiconductor region 11. At this time, noise in the interface is suppressed by the P-type semiconductor region 12.

An N-type semiconductor region 13 is disposed on the under surface of the photoelectric conversion unit 1. The impurity concentration of the semiconductor region 13 is lower than the impurity concentration of the semiconductor region 11 that is of the same N-type. Thereby, charges generated at a deep position are trapped in the semiconductor region 13 and therefore noise is suppressed. The semiconductor region 13 may be of P-type. Furthermore, a P-type semiconductor region 15 that serves as a potential barrier against charges is disposed on the under surface of the semiconductor region 13.

The holding unit 2 has an N-type semiconductor region 21 disposed in the P-type well region 14. Charges transferred from the photoelectric conversion unit 1 are held in the semiconductor region 21. In the present embodiment, the impurity concentration of the semiconductor region 21 is higher than the impurity concentration of the semiconductor region 11 that is of the same N-type. Further, the area of the holding unit 2 in a plan view when it is orthographically projected on a semiconductor substrate is larger than the area of the photoelectric conversion unit 1 in the plan view. This allows the saturation charge amount of the holding unit 2 to be relatively larger than the saturation charge amount of the photoelectric conversion unit 1.

A gate electrode 40 is disposed via a gate insulating film on the upper side of the well region 14 between the semiconductor region 12 and the semiconductor region 21 to form the gate of the first transfer transistor M1. The first transfer transistor M1 is in an on-state when the voltage of the gate electrode 40 is positive, and transfers charges accumulated in the photoelectric conversion unit 1 to the holding unit 2. On the other hand, the first transfer transistor M1 is in an off-state when the voltage of the gate electrode 40 is negative. A gate electrode 50 is disposed via a gate insulating film on the upper side of the well region 14 between the semiconductor region 21 and the floating diffusion unit 3 to form the gate of the second transfer transistor M2. Halls can be induced on the surface of the N-type semiconductor region 21 by applying a negative voltage to the gate electrode 40. This can suppress noise generated in the interface.

When the first transfer transistor M1 is in an on-state, leakage of charges from the semiconductor region 21 may cause a small noise. On the other hands, when the first transfer transistor M1 is in an off-state, such a noise is suppressed since holes are induced on the surface of the semiconductor region 21. It is therefore preferable for the first transfer transistor M1 to be controlled to have a reduced on-time.

An optical black portion 203 is formed of a metal such as tungsten, aluminum, or the like that is unlikely to pass a visible light, and shades the semiconductor region including the holding unit 2. The optical black portion 203 has an opening 204 over the photoelectric conversion unit 1. Over the opening 204, disposed are a color filter 10a that causes a light of a particular wavelength range of a visible light to pass and a micro lens 10b that converges an incident light.

In the present embodiment, the area of the orthographically projected photoelectric conversion unit 1 in the plan view of the semiconductor substrate is smaller than the area of the holding unit 2. Such a configuration can increase the saturation charge amount of a pixel while reducing noise.

In order to increase the saturation charge amount of the pixel 10, it is preferable for the holding unit 2 to have a large saturation charge amount. As used herein, the saturation charge amount of the pixel 10 is the maximum value of the charge amount generated during a one-frame exposure period that can be treated as a signal. Further, the saturation charge amount of the photoelectric conversion unit 1 is the maximum value of the charge amount that the photoelectric conversion unit 1 can accumulate, and the saturation charge amount of the holding unit 2 is the maximum value of the charge amount that the holding unit 2 can hold. The saturation charge amount of the holding unit 2 can be increased by increasing the impurity concentration of the semiconductor region 21 of the holding unit 2 or increasing the area of the semiconductor region in the plan view. An excessively high impurity concentration of the semiconductor region 21 is likely to cause noise due to a leakage current or the like. It is therefore possible to increase the saturation charge amount while suppressing the impurity concentration of the semiconductor region 21 by increasing the area of the semiconductor region 21.

In such a way, an increase in the area of the holding unit 2 allows for an increase in the saturation charge amount of the pixel while reducing noise. On the other hand, an increase in the area of the holding unit 2 results in a relatively smaller area of the photoelectric conversion unit 1, which makes it difficult to increase the saturation charge amount of the photoelectric conversion unit 1. According to the present embodiment, it is possible to maintain the saturation charge amount of the pixel while reducing the saturation charge amount of the photoelectric conversion unit 1 by the photoelectric conversion unit 1 performing accumulation multiple times in one frame.

Note that, although FIG. 3 depicts the pixel 10 with front surface irradiation, the pixel 10 with back surface irradiation may be employed. Further, although the holding unit 2 is formed on the P-type well region 14, the holding unit 2 may be formed on an N-type well region. In this case, N-type and P-type are exchanged and holes instead of electrons are held in the holding unit 2, and a high level and a low level of the control signals supplied to the pixel 10 are exchanged.

Figure 4:
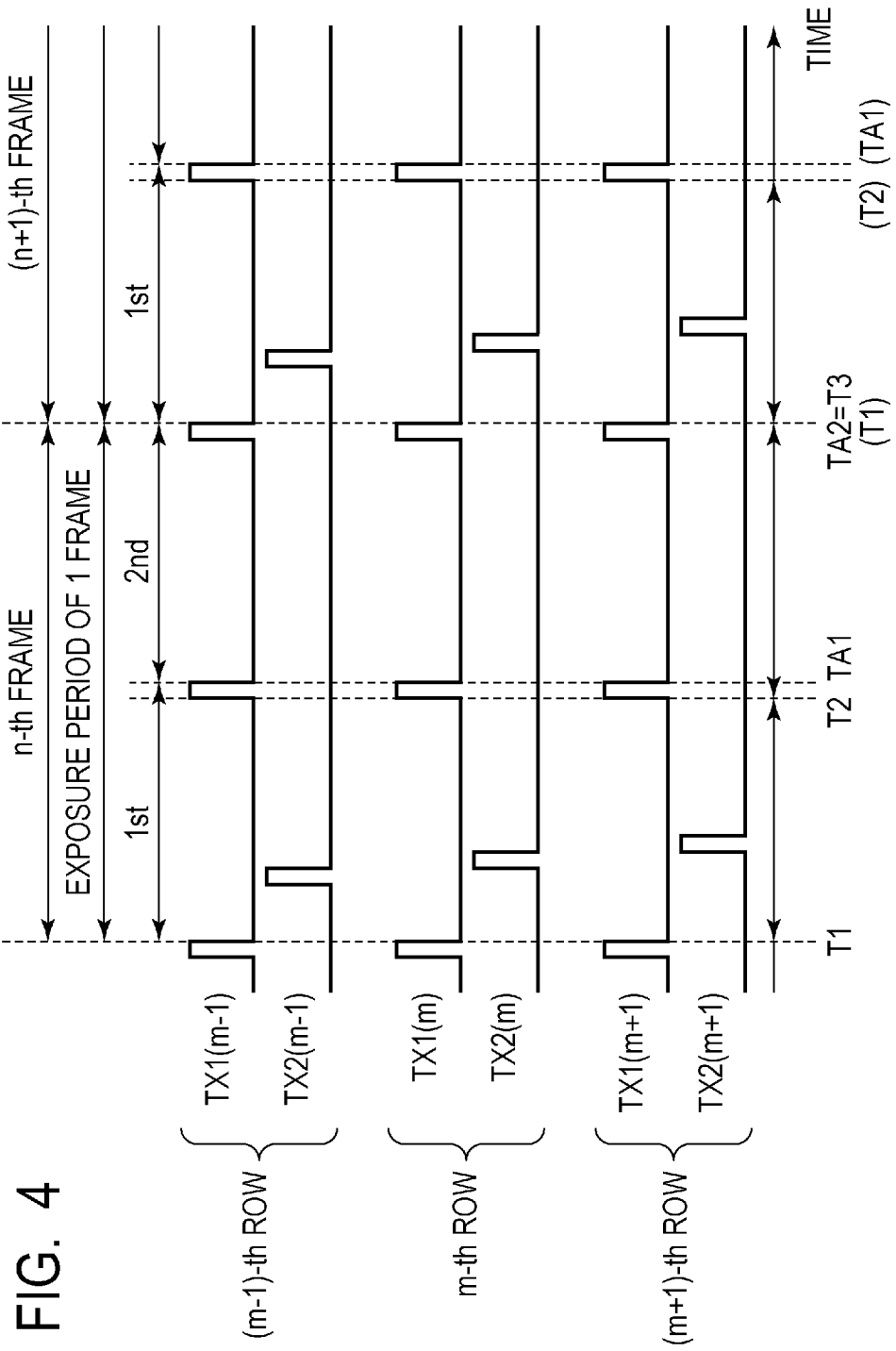
FIG. 4 is a timing chart of control signals of the image device according to the first embodiment of the present invention.

FIG. 4 is a timing chart of the image device according to the present embodiment and illustrates the control signals TX1 and TX2 on the (m−1)-th to (m+1)-th rows. As described above, the control signal TX1 is a signal applied to the gates of the first transfer transistors M1, and the control signal TX2 is a signal applied to the gates of the second transfer transistors M2. When the control signal(s) is a high level, the corresponding transistor(s) is turned on and, when the control signal(s) is a low level, the corresponding transistor(s) is turned off. Note that, although FIG. 4 illustrates control signals on the (m−1)-th to (m+1)-th rows only, other rows are driven in the same manner.

Before time T1, the pixel unit 100 has performed exposure of the previous frame. Exposure as used herein refers to an operation in which charges generated by a photoelectric conversion are accumulated or held as a signal. Charges generated before the time T1 have been held in the holding units 2. At the time T1, the first transfer transistors M1 of all the pixels are simultaneously turned off from an on-state. Thereby, an exposure period of the previous frame ends. That is, charges of the photoelectric conversion units 1 are all transferred to the holding units 2, and the photoelectric conversion units 1 are set to an initial state. At the same time, an exposure period of the n-th frame starts. That is, the photoelectric conversion units 1 of the pixels on respective rows simultaneously start accumulating charges. In such a way, in response to the first transfer transistors M1 being turned off, accumulation of charges by the photoelectric conversion units 1 is started.

From the time T1 to T2, that is, in a read-out period, the control signal TX1 is a low level and the first transfer transistors M1 are maintained in an off-state. Although the first transfer transistors M1 of all the pixels 10 are maintained in an off-state in the present embodiment, the first transfer transistor M1 of at least one pixel may be maintained in an off-state from the time T1 to the time T2. In a read-out period, the photoelectric conversion units 1 accumulate charges and the holding units 2 hold charges generated in the previous frame. Note that, in order to suppress noise due to a leakage current in the first transfer transistor M1, a shorter on-time of the first transfer transistor M1 is preferable.

During the read-out period, charges of the holding units 2 are sequentially read out to the floating diffusion units 3. Specifically, the control signal TX2($m-1$) on the (m−1)-th row changes from a low level to a high level and the second transfer transistors M2 are turned on. Thereby, the second transfer transistors M2 transfer charges of the holding units 2 of the pixel on the (m−1)-th row to the floating diffusion units 3. The voltage of the floating diffusion units 3 changes in accordance with the capacitances of the floating diffusion units 3 and the amount of transferred charges. Pixel signals based on the voltages of the floating diffusion units 3 are read out from the amplification transistors M3 to the column signal lines 5. The column amplification circuit 102 amplifies pixel signals on the column signal lines 5, and the output circuit 104 sequentially outputs the pixel signals. In the same manner, the control signal TX2($m$) on the m-th row and the control signal TX2($m+1$) on the (m+1)-th row sequentially change from a low level to a high level and charges are read out. In such a way, read-out operations are performed on a row basis for each of the pixels on the first row to the pixels on the last row. Note that read-out operations may be on a multiple-row basis. After the pixels on the last row have been read out, the first transfer transistors M1 and the second transfer transistors M2 of all the pixels are in an off-state.

At the time T2, the first transfer transistors M1 on all the rows are simultaneously turned on, charges of the photoelectric conversion units 1 are transferred to the holding units 2. After the time T2, charges generated during the first exposure period are held by the holding units 2. In the present embodiment, the first transfer transistors M1 of all the pixels are simultaneously transitioned from an off-state to an on-state. However, it is sufficient that the first transfer transistors M1 of a plurality of pixels have been turned on by the time T2, and thus the timing of the transition from an off-state to an on-state may be different from each other. For example, the first transfer transistors M1 may be turned on in the order from the first transfer transistor M1 included in a pixel which has completed the read-out operation described above.

Then, at time TA1, the first transfer transistors M1 on all the rows are simultaneously turned off. Thereby, while the holding units 2 hold charges generated during a read-out period, the photoelectric conversion units 1 start accumulating charges generated thereafter. As used herein, a period from the time T1 to the time TA1 is referred to as a first exposure period, and a period from the time TA1 to time TA2 is referred to as a second exposure period. Each of the exposure periods is a period from the time when the first transfer transistors M1 are turned off to the next time when the first transfer transistors M1 are turned off. Note that, in the following description, the first exposure period may be referred to as a first period, and the second exposure period may be referred to as a second period.

Then, before time T3, the first transfer transistors M1 are simultaneously turned on. Charges generated during the second period are transferred from the photoelectric conversion units 1 to the holding units 2, and the holding units 2 hold both charges generated during the first exposure period and charges generated during the second exposure period. Note that any timing can be set for the timing of turning on of the first transfer transistors M1. For example, the first transfer transistors M1 may be maintained in an on-state during the second exposure period. In this case, charges generated in the photoelectric conversion units 1 during the second exposure period are immediately transferred to the holding units 2.

At the time T3, the first transfer transistors M1 on all the rows are simultaneously turned off from an on-state. The time T3 is the same time as the time TA2. The second exposure period ends and the exposure period of the n-th frame ends. In such a way, for all the pixels, exposure periods match each other. That is, for all the pixels, exposure starts at the time T1 and ends at the time T3. Further, exposure of the (n+1)-th frame is started at the time T3 and operation from the time T1 to the time T3 is then repeated. Note that it is desirable that the first and second exposure periods have substantially the same length. Note that, although the example in which charge transfers from the photoelectric conversion units 1 to the holding units 2 are performed twice in one frame has been described in the present embodiment, three or more charge transfers may be performed as described later.

Figure 5:
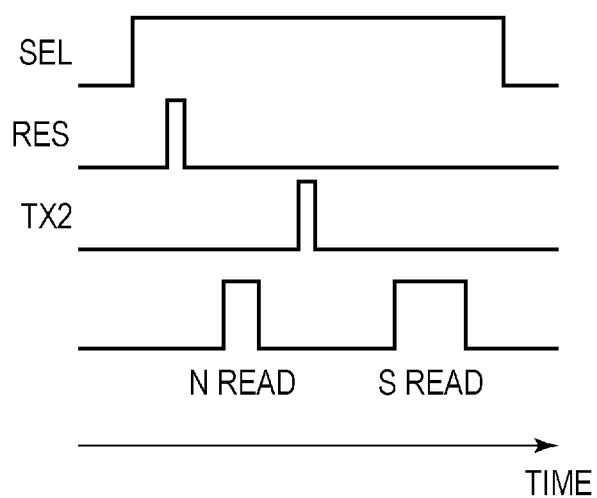
FIG. 5 is a timing chart of a pixel of the image device according to the first embodiment of the present invention.

FIG. 5 is a timing chart of control signals according to the present embodiment and illustrates a read-out operation of a pixel signal. FIG. 5 illustrates the control signal SEL supplied to the selection transistor M4, the control signal RES supplied to the reset transistor M5, and the control signal TX2 supplied to the second transfer transistor M2. The transistors M2, M4, and M5 are in an on-state when respective corresponding control signals are a high level, and the transistors M2, M4, and M5 are in an off-state when respective corresponding control signals are a low level.

With reference to FIG. 1 and FIG. 5, a read-out operation of a pixel signal will be described below. First, the vertical scanning circuit 101 sets the control signal SEL to a high level to turn on the selection transistor M4 and select the pixel 10 from which a signal is read out. Next, the vertical scanning circuit 101 sets the control signal RES to a high level to turn on the reset transistor M5. In response to the reset transistor M5 being turned on, the voltage of the floating diffusion unit 3 is reset to the power supply voltage. After the reset transistor M5 is turned off, the column amplification circuit 102 performs a read-out (N read) of a pixel signal occurring at the resetting from the column signal line 5. The vertical scanning circuit 101 sets the control signal TX2 to a high level to turn on the second transfer transistor M2 and transfer charges of the holding unit 2 to the floating diffusion unit 3. The column amplification circuit 102 performs a read-out (S read) of a pixel signal occurring at a photoelectric conversion from the column signal line 5. The pixel signals read out in such a way are subjected to a correlated double sampling process in the column amplification circuit 102 or the output circuit 104 and are output from the output circuit 104. Note that a correlated double sampling process may be performed after pixel signals are subjected to an AD conversion.

Figure 6:
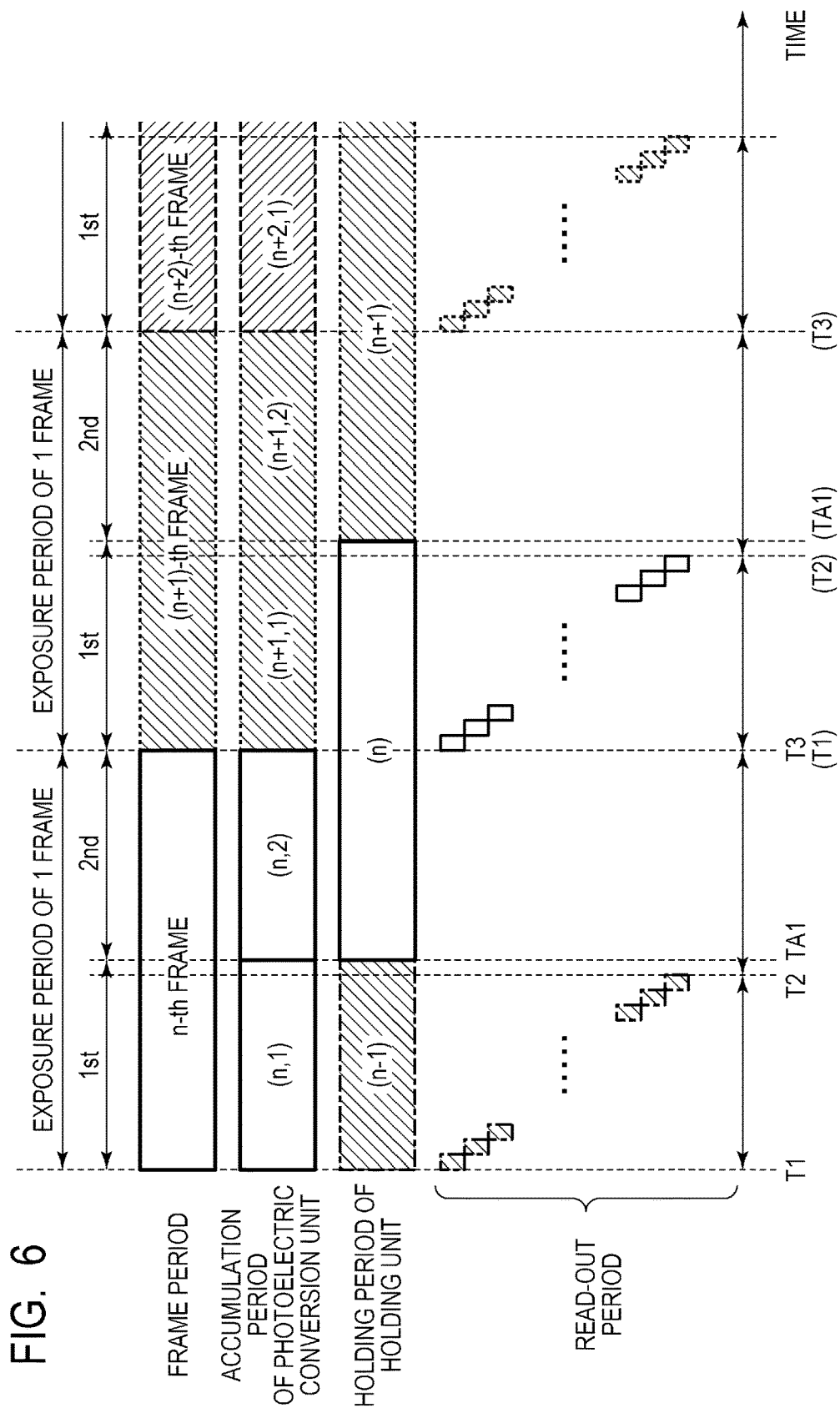
FIG. 6 is a diagram schematically illustrating operation of the image device according to the first embodiment of the present invention.

FIG. 6 is a diagram schematically illustrating operation of the image device according to the present embodiment and illustrates a capturing operation from the n-th frame to the (n+1)-th frame. Operations for the n-th frame are represented in solid lines and operations for the (n+1)-th frame are represented in dotted lines.

FIG. 6 illustrates frame periods, accumulation periods of the photoelectric conversion units 1, holding periods of the holding units 2, and read-out periods. The read-out period is a period in which read-out operations for a plurality of pixels are performed. In this example, the read-out operation is an operation that includes transferring of charges by the second transfer transistors M2 and outputting of signals by the amplification transistors M3.

At the time T1, the photoelectric conversion unit 1 starts charge accumulation in a first accumulation period (n, 1) of the n-th frame. At this time, the holding units have accumulated charges based on photoelectric conversions of the (n−1)-th frame. The vertical scanning circuit 101 sequentially scans respective rows, and the column amplification circuit 102 outputs pixel signals that are based on charges of the holding units 2. At the time when a read-out period has elapsed from the time T1, that is, at the time T2, upon the completion of the read-out of the pixel signals of the (n−1)-th frame, the first transfer transistors M1 are turned on and charges accumulated in the photoelectric conversion units 1 are transferred to the holding units 2. The first transfer transistors M1 are then turned off, and thereby the first accumulation period (n, 1) ends and the second accumulation period (n, 2) starts. The first transfer transistors M1 are turned on immediately before the time T3 and the first transfer transistors M1 are turned off at the time T3. This causes charges accumulated in the photoelectric conversion units 1 to be transferred to the holding units 2, and the second accumulation period (n, 2) ends. The holding units 2 hold charges that are based on the first and second exposure periods of the n-th frame. In a similar manner, capturing operations of the (n+1)-th frame and the (n+2)-th frame are repeatedly performed.

As illustrated in FIG. 6, at the same time as the end of exposure of one frame, exposure of the next frame can be started. Therefore, this can eliminate a period in which no exposure is performed, that is, a period in which information misses and this allows for a global electronic shutter operation with an improved image quality.

Further, the photoelectric conversion units 1 perform charge accumulation twice in one frame. While charges from the holding units 2 are being read out during the read-out period, the photoelectric conversion units 1 are performing charge accumulation. In the second exposure period following the first exposure period, while the holding units 2 hold charges of the first exposure period, the photoelectric conversion units 1 can perform new charge accumulation. Thus, the saturation charge amount of pixels can be increased with a use of the photoelectric conversion units 1 having a small saturation charge amount.

An exposure period of one frame is a sum of a read-out period (T1 to T2) of a pixel signal and the remaining period (T2 to T3) and is equal to a sum of the first exposure period and the second exposure period. Charges of the previous frame held in the holding units 2 are read out in the read-out period. Upon the completion of the read-out of charges of the previous frame from the holding units 2, the holding units 2 can newly hold charges of the subsequent frame. Therefore, it is sufficient for the photoelectric conversion units 1 to be able to accumulate at least charges generated during the first exposure period. Typically, since the charge amount generated during the first exposure period is less than the amount of charges generated during an exposure period of one frame, the saturation charge amount of the photoelectric conversion unit 1 can be reduced.

Although a period in which the holding units 2 hold charges is longer than a read-out period in the present embodiment, the read-out period (T1 to T2) may be equal to the period (T2 to T3), or the read-out period (T1 to T2) may be longer than the period (T2 to T3).

Note that, although the read-out is performed in the order from the first row in FIG. 6, the order of read-out operations is not limited thereto. At least one read-out is needed for each pixel in a read-out period and thus any order of the read-out is possible. Further, in the holding unit 2 of each pixel, a period from the time when holding of charges is started in one frame to the time when holding of charges is started in the next frame is equal to the exposure period.

It is preferable that the ratio of a sum of the read-out period (T1 to T2) and the period (T2 to T3) to the read-out period (T1 to T2) be substantially the same as the ratio of the saturation charge amount of the holding unit 2 to the saturation charge amount of the photoelectric conversion unit 1.

In the present embodiment, the first accumulation period is substantially the same as the read-out period, the ratio of an exposure period of one frame to the read-out period is approximately two, and the read-out period is around one-half the exposure period of one frame. Therefore, for example, when a motion image of 60 frames per second is taken, the read-out period will be approximately 1/120 seconds.

In this case, the ratio of the saturation charge amount of the holding unit 2 to the saturation charge amount of the photoelectric conversion unit 1 is preferably close to two. This is because, while the holding units 2 hold all the charges generated during an exposure period of one frame, it is sufficient for the photoelectric conversion units 1 to hold one-half the entire charges. Based on such a ratio of the saturation charge amounts, sizes of the photoelectric conversion unit 1 and the holding unit 2 on the semiconductor substrate can be optimized.

Note that image device of the present embodiment may have a rolling shutter operation mode in addition to the global electronic shutter. The rolling shutter is an operation mode that sequentially starts accumulation of charges of pixels by the photoelectric conversion unit 1 on a row basis or on a multiple-row basis. The first transfer transistors M1 of the pixels are then controlled to be sequentially turned on a row basis or a multiple-row basis. Further, the image device may have an operation mode of a global electronic shutter of other technologies along with the above. For example, a global electronic shutter by other technologies may be such an operation mode that a period of the photoelectric conversion units 1 accumulating charges is the same as an exposure period.

As described above, according to the present embodiment, it is possible to maintain or increase the saturation charge amount of a pixel while suppressing the saturation charge amount of a photoelectric conversion unit. Sizes of a photoelectric conversion unit and a holding unit can be optimized and a global electronic shutter with reduced noise can be realized.

Second Embodiment

An image device according to the second embodiment will be described. Although the number of times of charge transfers from the holding units to the amplification units during an exposure period of one frame is two in the first embodiment, the number of times of charge transfers is k without limited to two in the present embodiment. In the following, features that are different from those of the first embodiment will be mainly described, and description of features similar to those of the first embodiment will be omitted.

Figure 7:
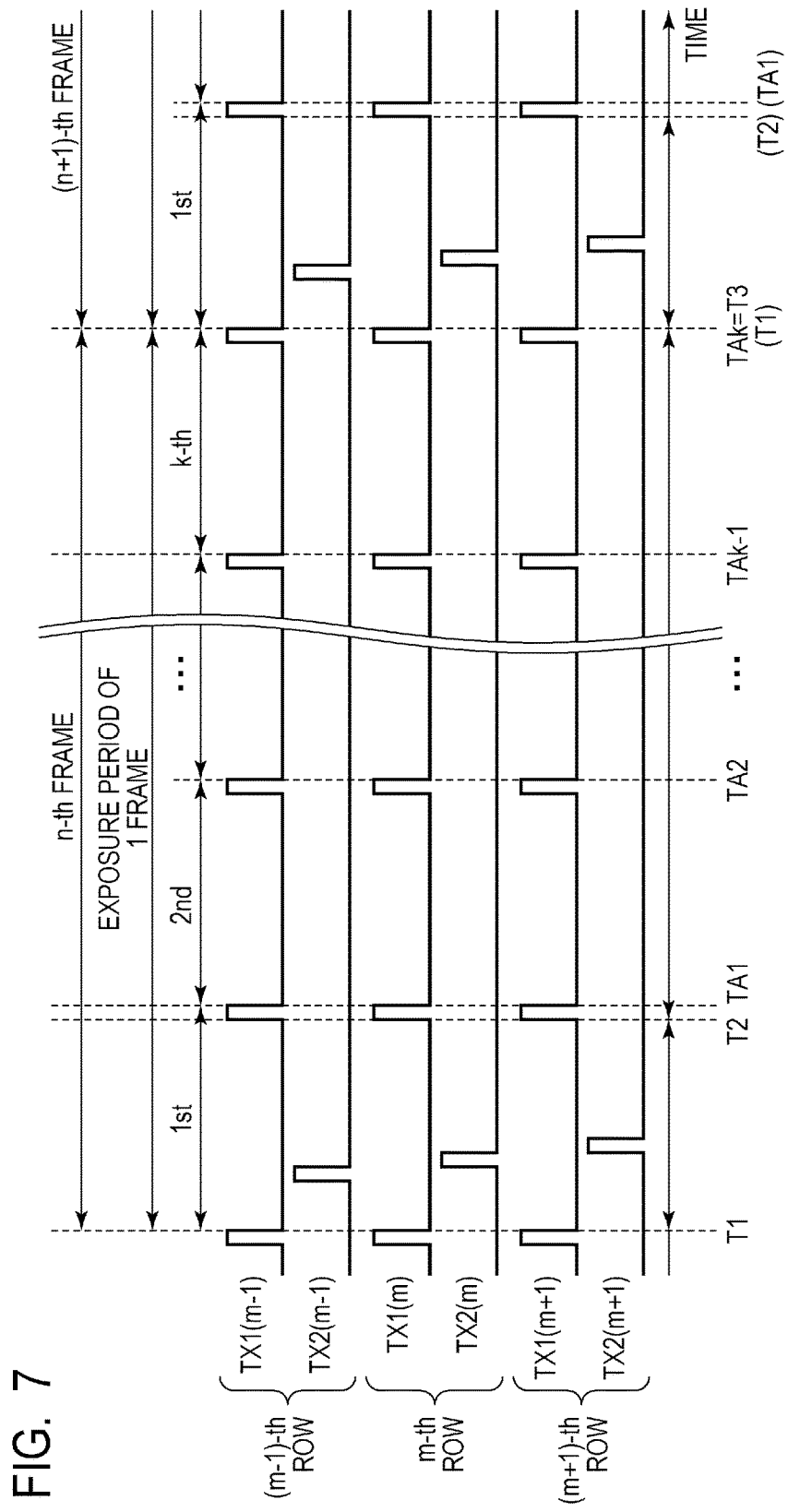
FIG. 7 is a timing chart of an image device according to a second embodiment of the present invention.
Figure 8:
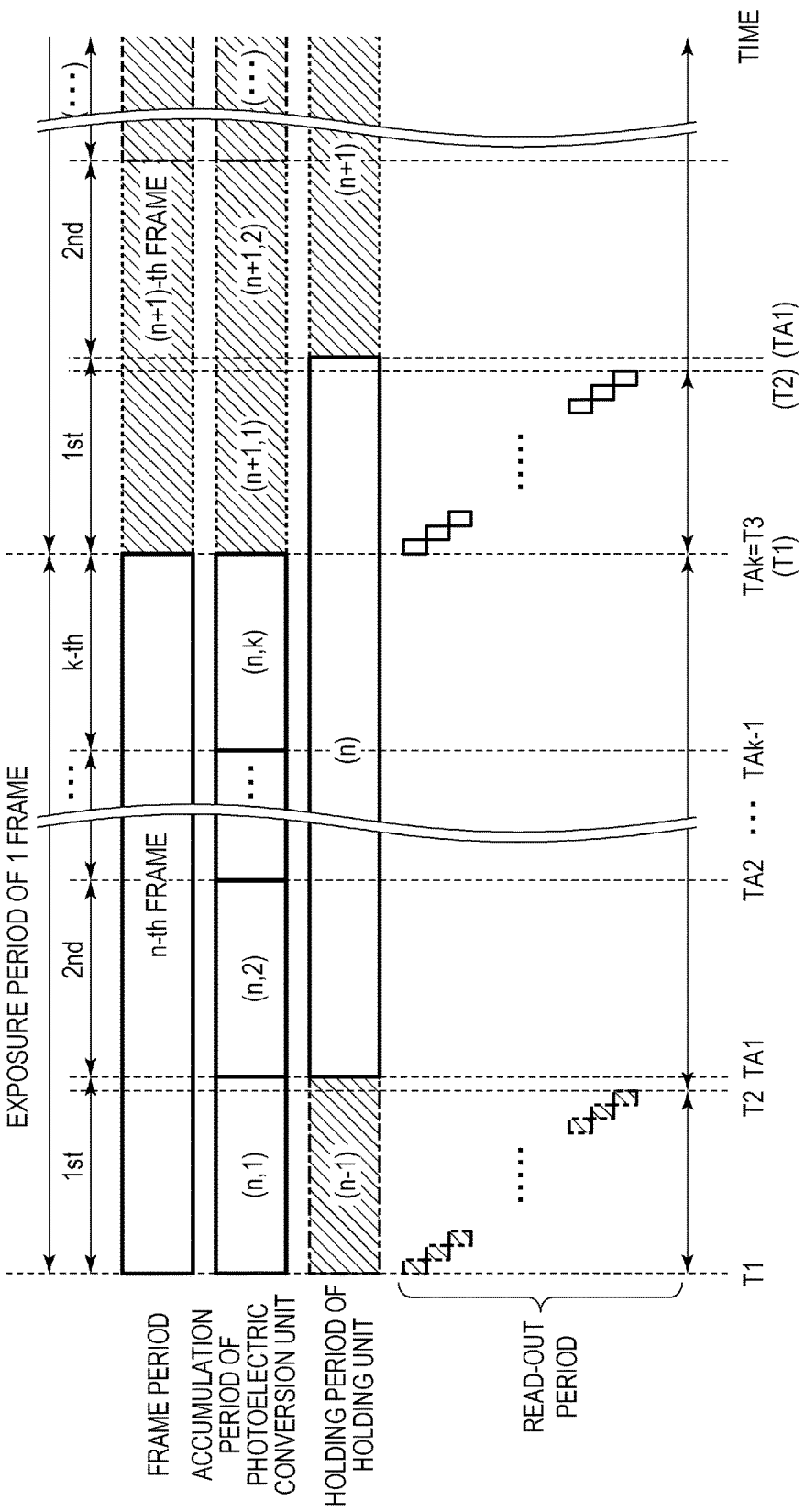
FIG. 8 is a diagram schematically illustrating operation of the image device according to the second embodiment of the present invention.

FIG. 7 is a timing chart of control signals of the image device according to the present embodiment, and FIG. 8 is a diagram schematically illustrating operation of the image device according to the present embodiment. In FIG. 7 and FIG. 8, the first accumulation period corresponds to the first period, and the second to k-th accumulation period correspond to the second period.

From the time T1 to T2, that is, during a read-out period, while the floating diffusion units 3 read out charges accumulated during the previous frame to the holding units 2, the photoelectric conversion units 1 accumulate charges during the first accumulation period. From the time T2 to TA1, the first transfer transistors M1 are in an on-state, and thereby charges of the first accumulation period (n, 1) of the n-th frame are transferred from the photoelectric conversion units 1 to the holding units 2. At the time TA1, the first transfer transistors M1 are turned off and, from the time TA1 to TA2, the photoelectric conversion units 1 then perform accumulation of charges in the second accumulation period (n, 2). In the same manner for the subsequent time, the third to k-th charge accumulation operations are performed, and charges generated during an exposure period of one frame are held in the holding units 2. At time T3, the second period ends and the k times of charge accumulation operations are completed. In the present embodiment, k times of exposure periods can be provided without limited to two times. Note that k times of exposure periods are substantially the same period each other, and respective periods from the time when the first transfer transistors M1 are turned on to the next time when the first transfer transistors M1 are turned off are the same. The number of times k is preferably greater than the ratio of the saturation charge amount of holding unit 2 to the saturation charge amount of the photoelectric conversion unit 1.

Although a read-out period of pixel signals may not be necessarily the same as the first exposure period, it is desirable that the read-out period of pixel signals be completed within the first exposure period. Further, the interval of charge transfers from the photoelectric conversion units 1 to the holding units 2 is preferably constant. As used herein, the interval of charge transfers is from the time when the first transfer transistors M1 are transitioned from an on-state to an off-state to the next time when the first transfer transistor M1 is turned off from an on-state.

Since it is sufficient for the photoelectric conversion units 1 to be able to accumulate charges generated during a period whose length is 1/k the length of an exposure period of one frame, the saturation charge amount of the photoelectric conversion unit 1 can be reduced to 1/k the saturation charge amount of the holding unit 2. This allows a large amount of charges to be held in the holding unit 2 with a further smaller saturation charge amount of the photoelectric conversion unit 1. Further, with a constant interval of charge transfers from the photoelectric conversion units 1 to the holding units 2, the sizes of the photoelectric conversion unit 1 and the holding unit 2 can be optimized. Therefore, according to the present embodiment, the saturation charge amount can be increased, the sizes of a photoelectric conversion unit and a holding unit can be optimized, and a global electronic shutter with reduced noise can be realized.

Third Embodiment

Figure 9:
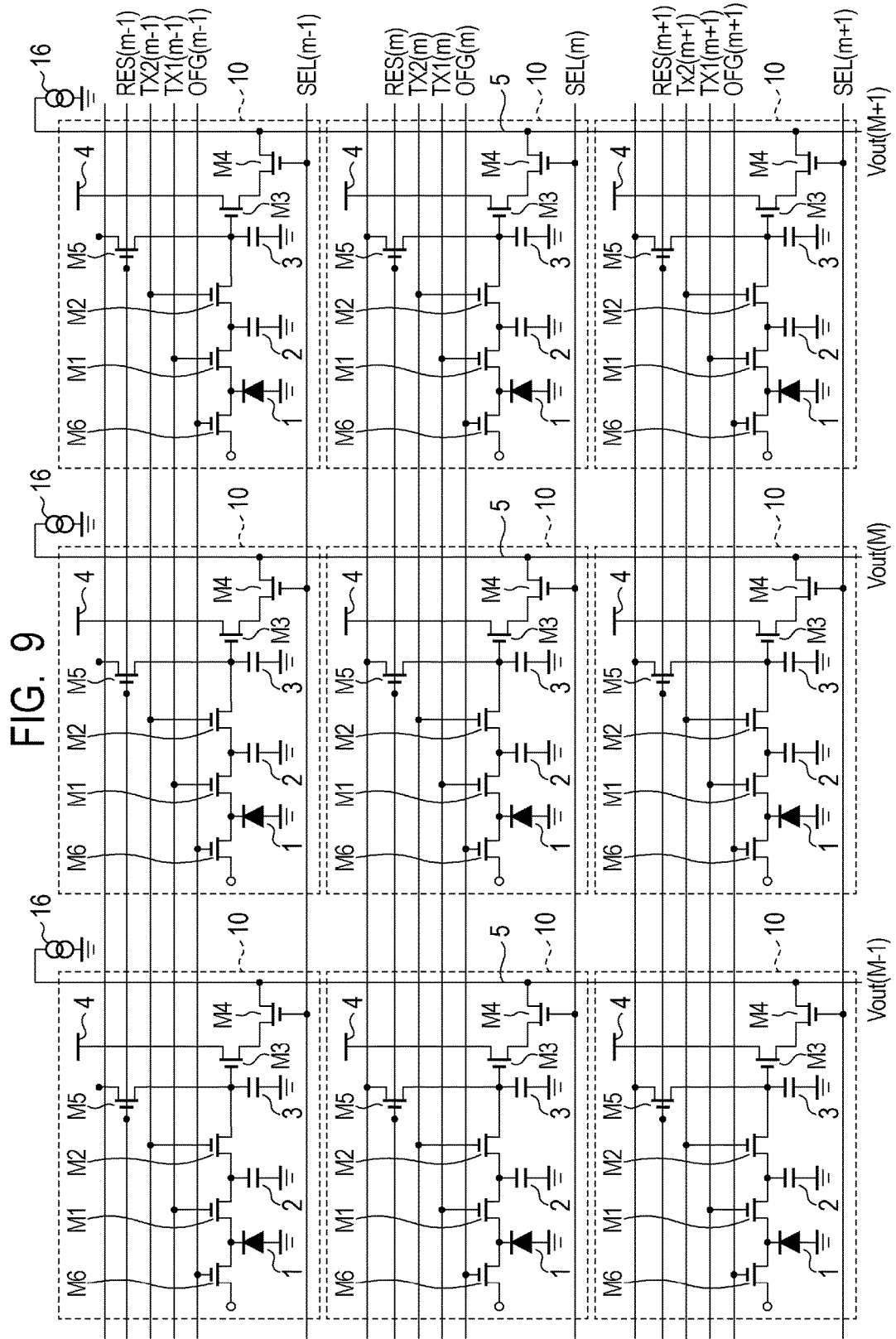
FIG. 9 is a diagram illustrating an equivalent circuit of pixels in an image device according to a third embodiment of the present invention.

An image device according to the third embodiment will be described mainly for features that are different from those of the first and second embodiments. FIG. 9 is a diagram illustrating an equivalent circuit of pixels according to the present embodiment. Each of the pixels 10 further has an overflow transistor M6 in addition to the configuration of the pixel of the first embodiment. The drain of the overflow transistor M6 is connected to a power supply node, and a control signal OFG is applied to the gate thereof. The overflow transistor M6 is turned on and thereby charges of the photoelectric conversion unit 1 can be drained to the overflow drain such as the power supply node.

Although exposure by the photoelectric conversion unit 1 is started by controlling the first transfer transistor M1 in the first embodiment, exposure can be started by controlling the overflow transistor M6 in the present embodiment. Specifically, charge accumulation by the photoelectric conversion unit 1 is started by controlling the overflow transistor M6 from an on-state to an off-state. This allows for flexible setting of an exposure period compared to the first embodiment.

Figure 10:
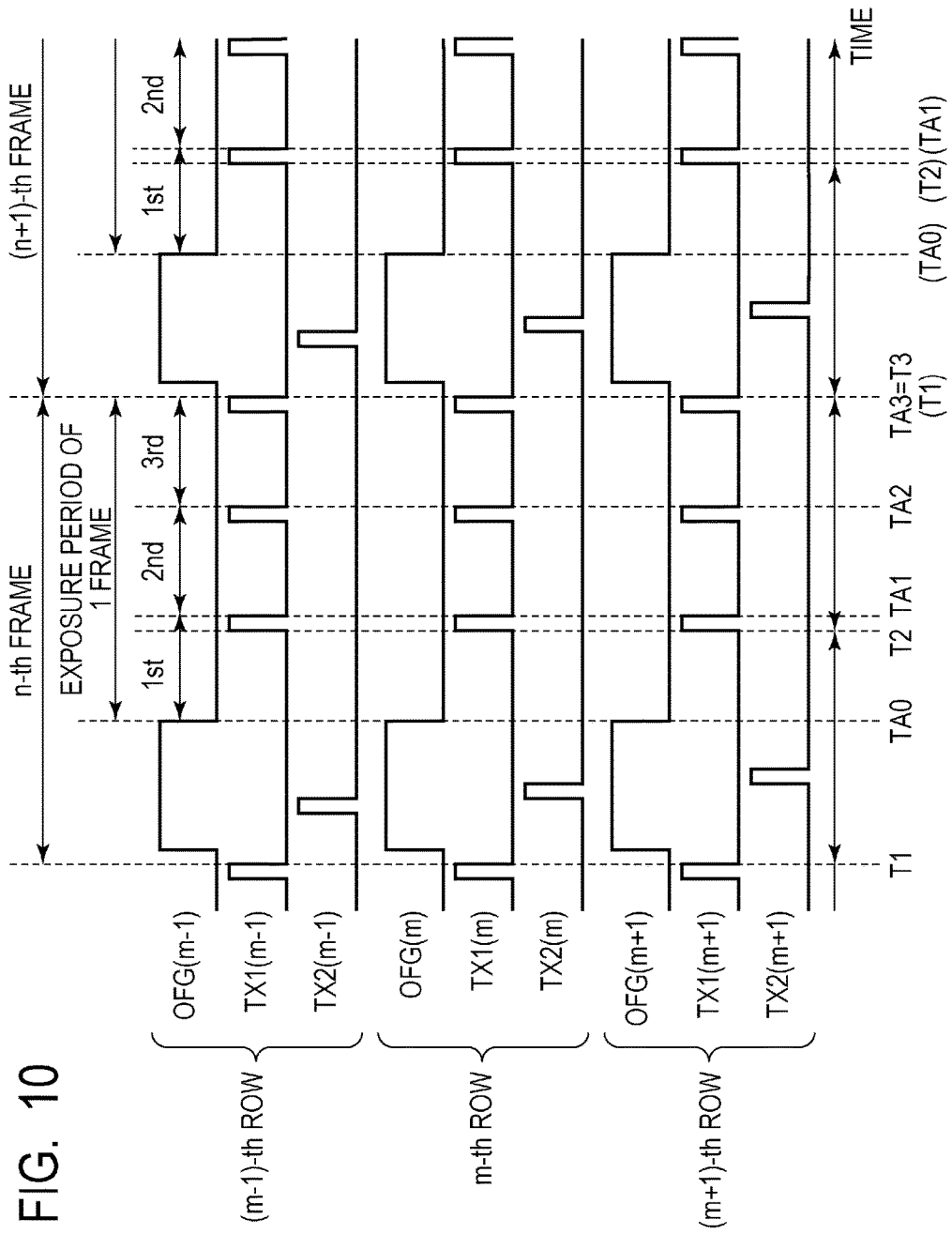
FIG. 10 is a timing chart of the image device according to the third embodiment of the present invention.
Figure 11:
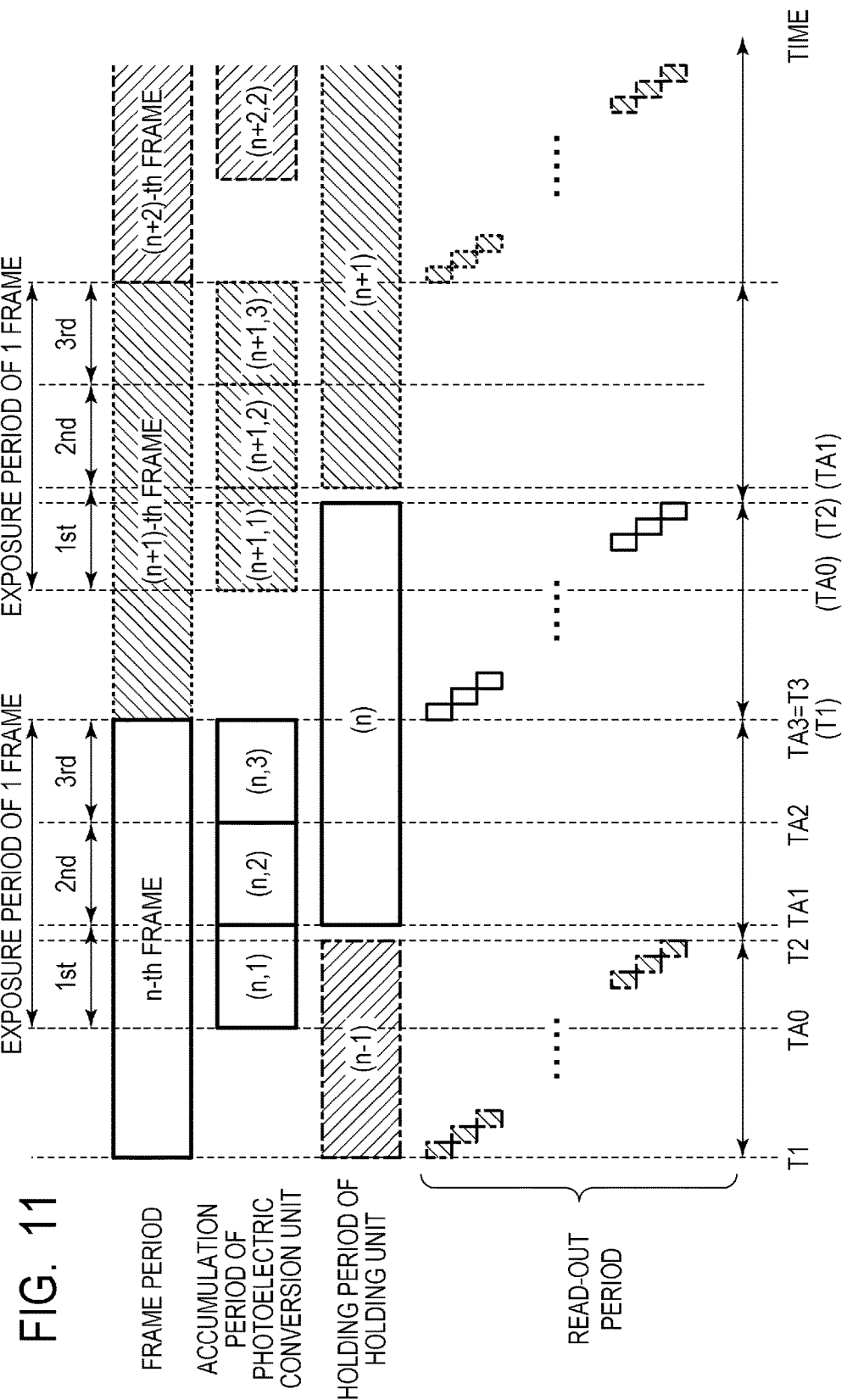
FIG. 11 is a diagram schematically illustrating operation of the image device according to the third embodiment of the present invention.

FIG. 10 is a timing diagram illustrating control signals of the pixels 10 in the image device according to the present embodiment, and FIG. 11 is a diagram schematically illustrating operation of the image device according to the present embodiment. FIG. 10 illustrates the control signals OFG, TX1, and TX2 supplied to the overflow transistors M6, the first transfer transistors M1, and the second transfer transistors M2. In FIG. 10, control signals for the (m−1)-th row, the m-th row, and the (m+1)-th row only are illustrated and control signals for other rows are omitted. In FIG. 10 and FIG. 11, the first accumulation period corresponds to the first period, and the second to third accumulation periods correspond to the second period.

Before the time T1, the first transfer transistors M1 of all the pixels are simultaneously turned on, and charges of the (n−1)-th frame are transferred from the photoelectric conversion units 1 to the holding units 2. From the time T1 to T2, that is, during the read-out period, the second transfer transistors M2 are sequentially turned on, and charges of the (n−1)-th frame of the holding units are read out to the floating diffusion units 3. The overflow transistors M6 are maintained in an off-state from the time TA0 at a start of an exposure period of one frame to the time T3 at a start of the next frame period. During an exposure period of one frame in which the overflow transistors M6 are maintained in an off-state, charges are accumulated in the photoelectric conversion units 1.

At the time T1, the first transfer transistors M1 of all the pixels are turned off. The overflow transistors M6 are then turned on, and charges accumulated in the photoelectric conversion units 1 are drained. Then, during a drain period before the time TA0, the overflow transistors M6 are maintained in an on-state and charges in the photoelectric conversion units 1 continue to be drained. At the time TA0, the overflow transistors M6 are turned off, and an exposure period of one frame starts. The photoelectric conversion units 1 of all the pixels start accumulating charges and the first accumulation period (n, 1) starts. Therefore, the time TA0 that is the start of exposure can be flexibly set by controlling the timing of transition of the overflow transistors M6 from an on-state to an on-state.

At the time T2, upon the completion of the read-out period of pixel signals, the first transfer transistors M1 of all the pixels are turned on. Thereby, charges during the accumulation period (n, 1) of the n-th frame are transferred from the photoelectric conversion units 1 to the holding units 2. At the time TA1, the first transfer transistors M1 are turned off, and the second accumulation period (n, 2) starts. Before the time TA2, the first transfer transistors M1 are turned on and charges of the second accumulation period (n, 2) are transferred from the photoelectric conversion units 1 to the holding units 2. At the time TA2, the first transfer transistors M1 are turned off, and the photoelectric conversion units 1 start charge accumulation of the third accumulation period (n, 3). At the time TA3, the first transfer transistors M1 are turned off, and charges of the third accumulation period (n, 3) are transferred from the photoelectric conversion units 1 to the holding units 2. At this time, the holding units 2 have held all the charges of the first to third accumulation periods of the n-th frame. At the time TA3, the exposure period of the n-th frame ends. At the time T3(TA3), the first transfer transistors M1 are turned off and the overflow transistors M6 are turned on. Thereby, the current capturing process of the n-th frame ends and the next capturing process of the (n+1)-th frame starts. Charges of the n-th frame accumulated in the holding unit 2 are read out during a read-out period of the (n+1)-th frame.

For each frame of the (n+1)-th and subsequent frames, the process described above is repeated. The first to third accumulation periods are equal to each other and each of them is one-third the exposure period of one frame. That is, a transfer interval of charges from the photoelectric conversion units 1 to the holding units 2 is constant. In this example, three times of accumulation periods occur from the time TA0 to TA1, from the time TA1 to TA2, and from the time TA2 to TA3, respectively. The interval of the first charge transfer is from the time when the overflow transistors M6 are turned off from an on-state to the time when the first transfer transistors M1 are turned off from an on-state. The interval of the second and subsequent charge transfers is from the time when the first transfer transistors M1 are turned off from an on-state to the next time when the first transfer transistors M1 are turned off from an on-state. The intervals of respective charge transfers may be the same or may be different each other.

In such a way, in the present embodiment, in addition to the advantages of the first embodiment, a global electronic shutter operation having a flexibly settable exposure period can be realized by using the overflow transistors M6. Further, the driving scheme may be changed depending on the brightness of the subject. For example, control signals may be driven with the timing illustrated in FIG. 4 in a usual situation, while control signals may be driven with the timing illustrated in FIG. 10 when a bright subject is taken.

Furthermore, in FIG. 11, an overlapping period (first accumulation period) of a read-out period and an exposure period is shorter than that in the first and second embodiments. It is therefore possible to set more times of exposure periods without reducing a read-out period of pixel signals. For example, let us assume that, when a motion image of 60 frames per second is taken, a read-out period is around 1/120 seconds and the accumulation time period is less than or equal to 1/80 seconds. In this case, three times of exposure periods can be set in one frame allowing for a reduction of the charge accumulation amount per one exposure period. This allows a larger amount of charges to be held in the holding units 2 without an increase of the saturation charge amount in the photoelectric conversion units 1.

According to the present embodiment, in addition to the advantages of the first embodiment, an exposure period can be flexibly set, and a global electronic shutter can be realized without causing saturation of signals even in the case of a subject with a high brightness. Further, it is possible to process a larger amount of charges without reducing a read-out period. Further, in the present embodiment, an exposure period of one frame starts during a read-out period. Since it is sufficient for the photoelectric conversion unit 1 to accumulate charges generated during a part of an exposure period of one frame in which an exposure period of one frame overlaps with a read-out period, the saturation charge amount of the photoelectric conversion unit 1 can be relatively smaller than the saturation charge amount of the holding unit 2.

Note that the number of times of exposure periods in one frame is not limited to three and may be generalized to k. Furthermore, when the effect of a leakage current generated in an on-state can be ignored, the first transfer transistors M1 may be maintained in an on-state during the second exposure period (time T2 to T3). In this case, charges generated during the second period are immediately transferred to the holding units 2. Further, the first to third exposure periods may have respective different lengths. Furthermore, the number of times of exposure periods may be different among respective rows. For example, four times of exposure periods may occur on the (m−1)-th row and two times of exposure periods may occur on the m-th row and the (m+1)-th row.

Fourth Embodiment

An image device according to the fourth embodiment will be described below by using FIG. 12 and FIG. 13. Although an exposure period of one frame overlaps with a read-out period in the third embodiment, an exposure period of one frame does not overlap with a read-out period in the present embodiment. In the following, the present embodiment will be described mainly for features that are different from those of the third embodiment.

Figure 12:
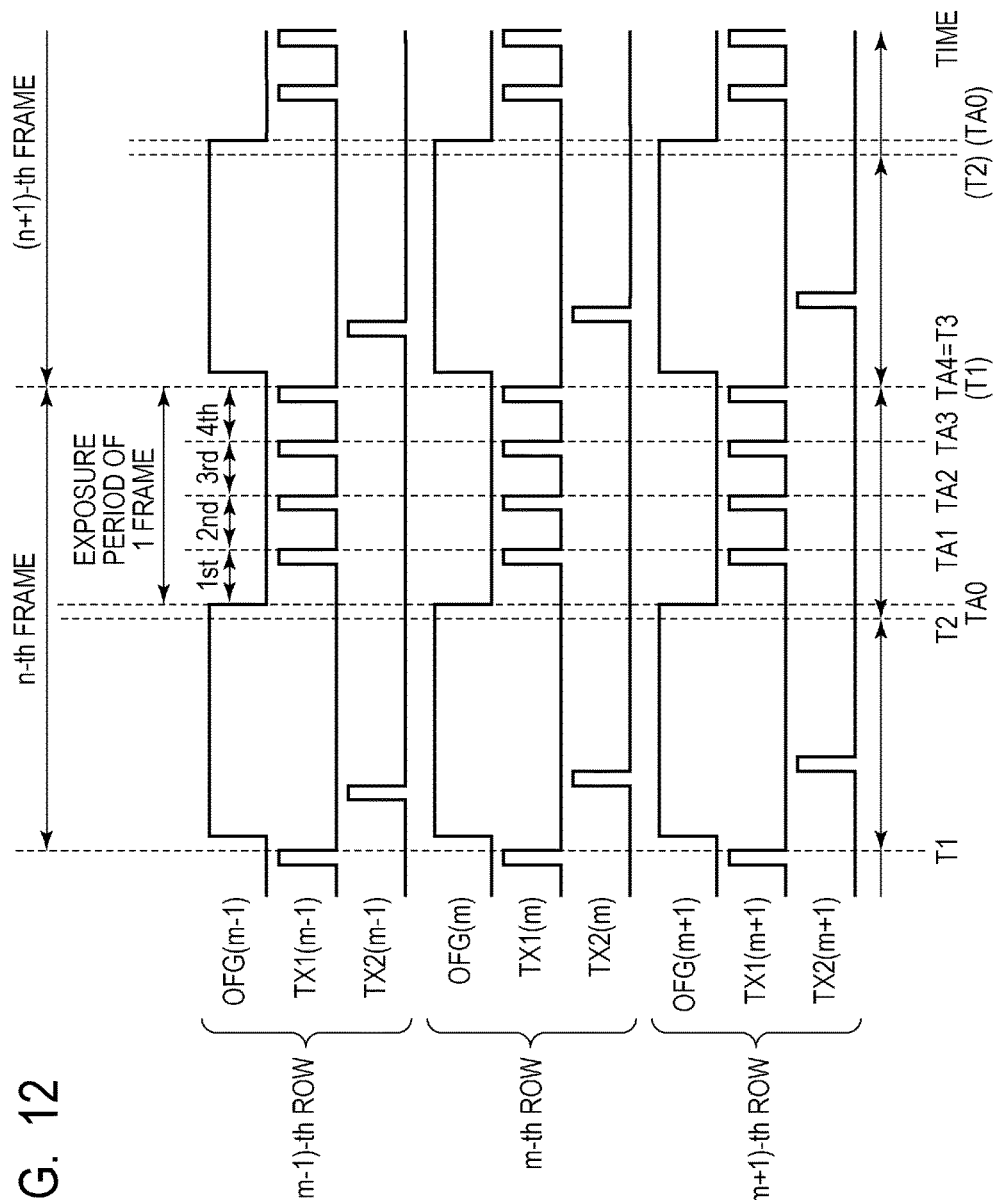
FIG. 12 is a timing chart of control signals of pixels in an image device according to a fourth embodiment of the present invention.
Figure 13:
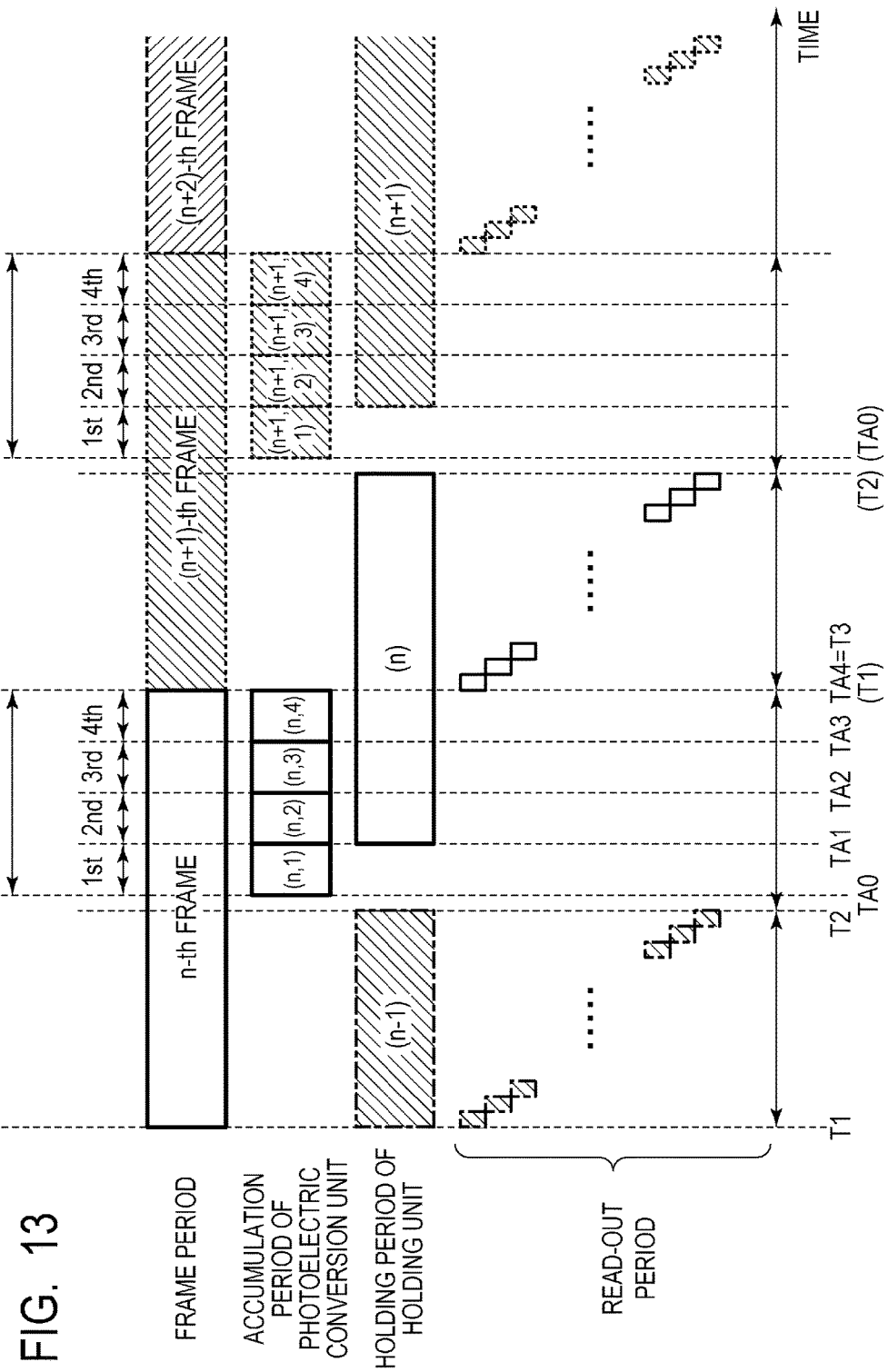
FIG. 13 is a diagram schematically illustrating operation of the image device according to the fourth embodiment of the present invention.

FIG. 12 is a timing chart of the pixels 10 in the image device according to the present embodiment, and FIG. 13 is a diagram schematically illustrating operation of the image device according to the present embodiment. In FIG. 12 and FIG. 13, the first accumulation period corresponds to the first period and the second to fourth accumulation periods correspond to the second period.

At the time T1, the first transfer transistors M1 of all the pixels are turned off. The overflow transistors M6 are then turned on and the charges accumulated in the photoelectric conversion units 1 are drained. From the time T1 to T2, the second transfer transistors M2 are sequentially turned on and the charges of the previous frame of the holding units 2 are read out to the floating diffusion units 3 of the amplification transistors M3. After the end of the read-out period (T1 to T2), at the time TA0, the overflow transistors M6 are turned off and an exposure period of one frame starts. The photoelectric conversion units 1 of all the pixels start accumulating charges, and the first accumulation period (n, 1) of the n-th frame starts. Before the time TA1, the first transfer transistors M1 are turned on, and charges of the first accumulation period (n, 1) are transferred from the photoelectric conversion units 1 to the holding units 2. Then, in the same manner, accumulation and transfer of charges are performed during the second to fourth accumulation periods (n, 2) to (n, 4). The first to fourth accumulation periods are equal to each other and each are one-fourth the exposure period of one frame. That is, the transfer interval of charges from the photoelectric conversion units 1 to the holding units 2 is constant. In this example, the interval of the first charge transfer is from the time when the overflow transistors M6 are turned off from an on-state to the time when the first transfer transistors M1 are turned off from an on-state. The interval of the second and subsequent times of charge transfers is from the time when the first transfer transistors M1 are turned off from an on-state to the next time when the first transfer transistors M1 are turned off from an on-state. The intervals of respective charge transfers may be the same or may be different each other.

In the present embodiment, a drain period in which overflow transistors are in an on-state continues until the time after a read-out period has elapsed. That is, an exposure period of one frame does not overlap with a read-out period, and an exposure period starts after the end of a read-out period. It is therefore possible to set more times of exposure periods than in the first to third embodiments without reducing a read-out period. For example, let us assume that, when a motion image of 60 frames per second is taken, a read-out period is around $1/120$ seconds and the accumulation time period is less than or equal to $1/120$ seconds. In this case, infinite times of exposure periods can be set in one frame in theory. Therefore, it is possible to accumulate a larger amount of charges without increasing the saturation charge amount of the photoelectric conversion unit 1. Further, also in the present embodiment, an exposure period of one frame can be flexibly set by controlling the timing of turning off the overflow transistors M6. Further, control signals may be driven with the timing illustrated in FIG. 4 in a usual situation, while control signals may be driven with the timing illustrated in FIG. 12 when a bright subject is taken.

According to the present embodiment, in addition to the advantages of the third embodiment, an exposure period can be flexibly set and a much larger amount of charges can be processed.

Fifth Embodiment

Figure 14:
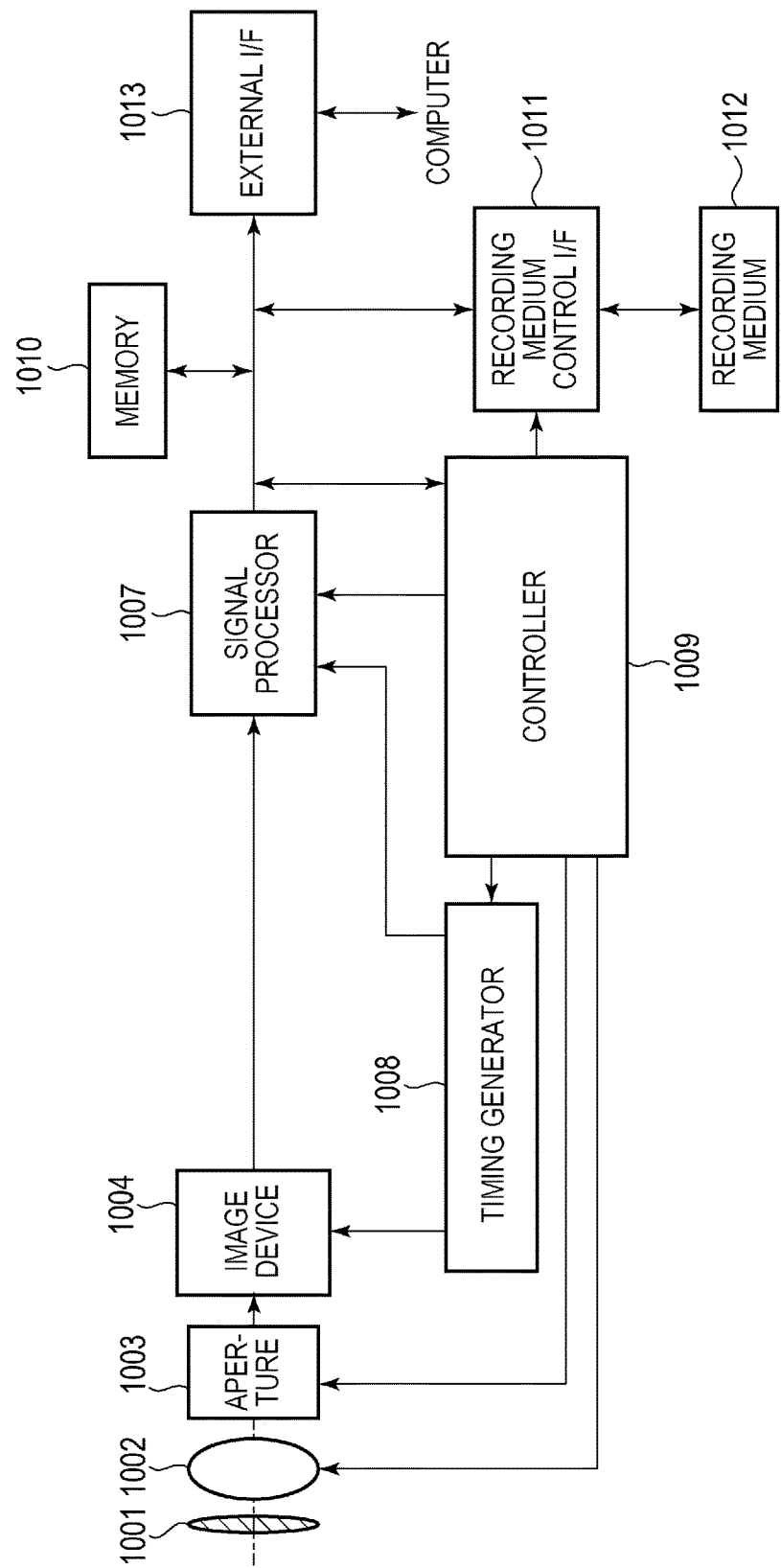
FIG. 14 is a block diagram of an image system according to a fifth embodiment of the present invention.

An image system according to the fifth embodiment will be described below by using FIG. 14. The image system of the present embodiment includes the image device of any of the first to fourth embodiments and may be, for example, a digital still camera, a digital camcorder, a copying machine, a facsimile, a mobile phone, an on-vehicle camera, an observation satellite, and the like. Further, the image system includes a camera module including optics such as a lens and an image device. FIG. 14 illustrates a block diagram of a digital still camera as an example of the image system. The image system illustrated in FIG. 14 includes a lens protection barrier 1001, a lens 1002, an aperture 1003, an image device 1004, and a signal processor 1007. Further, the image system includes a timing generator 1008, a controller 1009, a memory 1010, a recording medium I/F 1011, a recording medium 1012, and an external I/F 1013.

The lens protection barrier 1001 protects a lens 1002. The lens 1002 causes an optical image of a subject to be captured on the image device 1004. The aperture 1003 changes the amount of a light passing through the lens 1002. The image device 1004 is the image device described in the first to fourth embodiments and converts the optical image captured by the lens 1002 into image data. The signal processor 1007 performs various corrections and/or data compression to captured data output from the image device 1004. The timing generator 1008 outputs various timing signals to the image device 1004 and the signal processor 1007. The controller 1009 controls the entire digital still camera. The memory 1010 temporarily stores image data. The recording medium I/F 1011 performs recording or read-out of the recording medium 1012. The recording medium 1012 is a removable recording medium such as a semiconductor memory for recording or reading out captured data. The external I/F 1013 communicates with an external computer or the like.

Note that the timing signals may be supplied from the external of the image system, and it is sufficient for the image system of the present embodiment to include at least the image device 1004 and the signal processor 1007 that processes captured signals output from the image device 1004. An AD convertor may be provided to a semiconductor substrate of the image device 1004, or may be provided to a semiconductor substrate that is different from the semiconductor substrate of the image device 1004. Further, the image device 1004 and the signal processor 1007 may be formed on the same semiconductor substrate.

Other Embodiments

The embodiments described above are mere examples of the present invention and modified implementations thereof are possible without departing from the spirit of the present invention. Although photoelectric conversion units 1 which generate electrons are used in the embodiments described above, photoelectric conversion units 1 which generate holes may be used. In this case, the conductive types of transistors of the pixel 10 are opposite to those described above. Further, the source and drain of transistors may be exchanged depending on a conductive type of the transistors and the like.

In the second to fourth embodiments, although the transfer intervals of charges from the photoelectric conversion units 1 to the holding units 2 are substantially the same, respective transfer intervals may be different from each other. Furthermore, it is possible to dynamically control the interval of charge transfers depending on the brightness of a subject such that a brighter subject involves a shorter interval of charge transfers, for example.

In the first to third embodiments, the first transfer transistors M1 transfer charges from the photoelectric conversion units 1 to the holding units 2 in response to being turned on immediately after the end of a read-out period of pixel signals. The timing when the first transfer transistors M1 are turned on needs to be after the end of a read-out period and may be after a predetermined time has elapsed from the end of a read-out period.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-179226, filed Sep. 11, 2015, which is hereby incorporated by reference herein in its entirety.

What is claimed is:

1. An image device comprising a plurality of pixels, each of the pixels including a photoelectric conversion unit that accumulates charges generated by photoelectric conversions, a holding unit that holds the charges, an amplification unit that outputs signals based on the charges, a first transfer transistor that transfers the charges from the photoelectric conversion unit to the holding unit, a second transfer transistor that transfers the charges from the holding unit to the amplification unit, and an overflow transistor that drains the charges accumulated in the photoelectric conversion unit, wherein, in a read-out period of each frame, the second transfer transistors of the plurality of pixels are sequentially turned on to cause the charges of a previous frame to be transferred from the holding units to the amplification units, wherein the read-out period includes a drain period in which the overflow transistors of the plurality of pixels are in an on-state and a first period in which the overflow transistors and the first transfer transistors of the plurality of pixels are in an off-state to cause the photoelectric conversion units of the plurality of pixels to accumulate charges, wherein, in a second period following the first period, the photoelectric conversion units of the plurality of pixels accumulate charges generated in the second period while the holding units of the plurality of pixels hold the charges accumulated in the first period, wherein, in the first and second periods, each of the plurality of pixels performs a plurality of times of charge transfers from the photoelectric conversion unit to the holding unit by turning on the first transfer transistor, the plurality of times of charge transfers including a charge transfer performed at the end of the second period, and wherein transfers of the charges of the previous frame overlap in time with at least the drain period and/or accumulations of the charges in the first period.

2. An image device comprising a plurality of pixels, each of the pixels including a photoelectric conversion unit that accumulates charges generated by a photoelectric conversion, a holding unit that holds the charges, an amplification unit that outputs signals based on the charges, a first transfer transistor that transfers the charges from the photoelectric conversion unit to the holding unit, and a second transfer transistor that transfers the charges from the holding unit to the amplification unit, wherein, in a first period, the first transfer transistors of the plurality of pixels are in an off-state to cause the photoelectric conversion units of the plurality of pixels to accumulate charges, and the charges of a previous frame are read out from the holding unit to the amplification unit, wherein, in a second period following the first period, the photoelectric conversion units of the plurality of pixels accumulate charges generated during the second period while the holding units of the plurality of pixels hold the charges accumulated in the first period, and wherein, in the first and second periods, each of the plurality of pixels performs a plurality of times of charge transfers from the photoelectric conversion unit to the holding unit by turning on the first transfer transistor, the plurality of times of charge transfers including a charge transfer performed at the end of the second period, and an interval of the plurality of times of charge transfers is constant.

3. The image device according to claim 2, wherein the interval of the plurality of times of the charge transfers is from time when the first transfer transistor is turned off from an on-state to next time when the first transfer transistor is turned off from an on-state.

4. The image device according to claim 2, wherein each of the plurality of pixels further includes overflow transistor that drains the charges accumulated in the photoelectric conversion unit.

5. The image device according to claim 4,
wherein an interval of a first time of the charge transfers is from time when the overflow transistor is turned off from an on-state to time when the first transfer transistor is turned off from an on-state, and
wherein an interval of a second and subsequent times of the charge transfers is from time when the first transfer transistor is turned off from an on-state to next time when the first transfer transistor is turned off from an on-state.

6. The image device according to claim 4, wherein the interval of the plurality of times of the charge transfers is from time when the overflow transistor is turned off from an on-state to time when the first transfer transistor is turned off from an on-state.

7. The image device according to claim 4, wherein, within a period in which charges of the previous frame are read out from the holding units to the amplification units and before the first period, a drain period is provided in which the overflow transistors of the plurality of pixels are in an on-state.

8. The image device according to claim 4, wherein a drain period in which the overflow transistors of the plurality of pixels are in an on-state continues after a period in which charges of the previous frame are read out from the holding units to the amplification units has elapsed.

9. The image device according to claim 2, wherein, in at least a part of the second period, the second transfer transistors are maintained in an off-state.

10. The image device according to claim 1, wherein the charge transfers from the photoelectric conversion units to the holding units are performed in the plurality of pixels simultaneously at an end of the first period.

11. The image device according to claim 1, a number of the plurality of times of the charge transfers is greater than a ratio of a saturation charge amount of the holding unit to a saturation charge amount of the photoelectric conversion unit.

12. An image system comprising:
an image device according to claim 1; and
a signal processing device.

13. The image device according to claim 2, wherein the charge transfers from the photoelectric conversion units to the holding units are performed in the plurality of pixels simultaneously at an end of the first period.

14. The image device according to claim 2, a number of the plurality of times of the charge transfers is greater than a ratio of a saturation charge amount of the holding unit to a saturation charge amount of the photoelectric conversion unit.

15. An image system comprising:
an image device according to claim 2; and
a signal processing device.

16. A control method of an image device, wherein the image device comprises a plurality of pixels, each of the pixels including a photoelectric conversion unit that accumulates charges generated by a photoelectric conversion, a holding unit that holds the charges, an amplification unit that outputs signals based on the charges, a first transfer transistor that transfers the charges from the photoelectric conversion unit to the holding unit, and a second transfer transistor that transfers the charges from the holding unit to the amplification unit, the method comprising:
in a first period, accumulating charges in the photoelectric conversion units of the plurality of pixels and reading out the charges of a previous frame from the holding unit to the amplification unit, in response to the first transfer transistors of the plurality of pixels being in an off-state; and
in a second period following the first period, accumulating charges generated in the second period in the photoelectric conversion units of the plurality of pixels while the holding units of the plurality of pixels hold the charges accumulated in the first period,
wherein, in the first and second periods, in each of the plurality of pixels, performing a plurality of times of charge transfers from the photoelectric conversion unit to the holding unit by turning on the first transfer transistor, the plurality of times of charge transfers including a charge transfer performed at the end of the second period, and an interval of the plurality of times of charge transfers is constant.

17. The image device according to claim 1, wherein each of the pixels includes a reset transistor configured to reset an input node of the amplification unit included in the pixel,
wherein the reset transistor is in an off state at least when the second transfer transistors of a corresponding pixel is turned on.

18. The image device according to claim 2, wherein each of the pixels includes a reset transistor configured to reset an input node of the amplification unit included in the pixel, and
wherein the reset transistor is in an off state at least when the second transfer transistors of a corresponding pixel is turned on.

19. The image device according to claim 2, wherein the second transfer transistor is turned on in the first period.

* * * * *